United States Patent [19]

Yamagata et al.

[11] Patent Number: 5,086,352
[45] Date of Patent: Feb. 4, 1992

[54] OPTICAL MEMBERS AND BLANKS OR SYNTHETIC SILICA GLASS AND METHOD FOR THEIR PRODUCTION

[75] Inventors: Shigeru Yamagata; Kyoichi Inaki; Toshikatu Matsuya, all of Kohriyama, Japan; Ralf Takke, Hanau, Fed. Rep. of Germany; Thomas Stephan, Grosskrotzenburg, Fed. Rep. of Germany; Heinz Fabian, Hanau, Fed. Rep. of Germany

[73] Assignees: Shin-Etsu Quartz Products Co., Ltd.; Heraeus Quarzglas GmbH, both of Hanau, Fed. Rep. of Germany

[21] Appl. No.: 535,205

[22] Filed: Jun. 8, 1990

[30] Foreign Application Priority Data

| | | | |
|---|---|---|---|
| Jun. 9, 1989 | [JP] | Japan | 1-145226 |
| Jun. 14, 1989 | [JP] | Japan | 1-149466 |
| Jun. 19, 1989 | [JP] | Japan | 1-154620 |
| Jun. 19, 1989 | [JP] | Japan | 1-154621 |
| Sep. 11, 1989 | [JP] | Japan | 1-232983 |

[51] Int. Cl.$^5$ ............................ G02B 1/00; G02B 37/00
[52] U.S. Cl. .................................... 359/350; 65/3.11; 65/900; 252/588
[58] Field of Search .................... 350/1.1, 96.34, 320; 65/3.11, 3.12, 900; 252/588

[56] References Cited

U.S. PATENT DOCUMENTS

| | | | |
|---|---|---|---|
| 2,904,713 | 9/1959 | Heraeus et al. | 313/112 |
| 3,128,166 | 4/1964 | Mohn et al. | 65/18 |
| 3,128,169 | 4/1964 | Heraeus et al. | 65/111 |
| 3,485,613 | 12/1969 | Herezog et al. | 65/60 |
| 4,135,901 | 1/1979 | Fujiwara et al. | 65/3.12 |
| 4,389,230 | 6/1983 | Modone et al. | 65/900 |
| 4,553,995 | 11/1985 | Chigusa | 65/4.2 |
| 4,793,842 | 12/1988 | Yokota et al. | 65/3.11 |
| 4,812,153 | 3/1989 | Andrejco et al. | 65/900 |
| 4,885,019 | 12/1989 | Hutta | 65/3.11 |
| 4,902,325 | 2/1990 | Kyoto et al. | 65/31 |
| 4,938,788 | 7/1990 | Segawa et al. | 65/900 |

FOREIGN PATENT DOCUMENTS 40-10228 5/1965 Japan .
58-125635 7/1983 Japan .
39-23850 10/1989 Japan .

OTHER PUBLICATIONS

Brueckner "Properties and Structure of Vitreous Silica I", *Journal of Non-Crystalline Solids*, vol. 5 (1970) pp. 123-175.

Dodd et al., "Optical Determinations of OH in Fused Silica", *J. Applied Physics*, vol. 37, No. 10, p. 3911 (1966).

(List continued on next page.)

*Primary Examiner*—Bruce Y. Arnold
*Assistant Examiner*—Martin Lerner
*Attorney, Agent, or Firm*—Foley & Lardner

[57] ABSTRACT

The invention relates to lenses, prisms or other optical members which are subjected to high-power ultraviolet light having a wavelength of about 360 nm or less, or ionizing radiation, particularly optical members for use in laser exposure apparatus for lithography, and to blanks for such optical members. The homogeneity of the refractive index distribution and the resistance to optical deterioration when the optical members are exposed for a long period of time to short wavelength ultraviolet light from a laser beam are improved. The optical members are made of high-purity synthetic silica glass material containing at least about 50 wt. ppm of OH groups, and are doped with hydrogen. The refractive index distribution caused by the fictive temperature distribution during heat treatment in the process of producing high-purity silica glass blanks for optical members in accordance with the present invention is offset by the combined refractive index distribution determined by the OH group concentration distribution or by the OH group concentration distribution and the Cl concentration distribution in the glass.

39 Claims, 10 Drawing Sheets

O: Excellent
Δ: Average
×: Poor

OTHER PUBLICATIONS

Hosono et al., "Structural Defects and Vacuum UV Absorption in High Purity Synthetic Silica Glasses", *Ceramics,* vol. 22, No. 12, pp. 1047-51 (1987).

Imai et al., "UV and VUV Optical Absorption Due to Intrinsic and Laser Induced Defects in Synthetic Silica Glasses", *The Physics and Technology of Amorphous $SiO_2$,* Less Arcs, France (Jun. 29-Jul. 3, 1987).

Khotimchenko et al., "Determining the Content of Hydrogen Dissolved in Quartz Glass Using The Methods of Rama Scattering and Mass Spectrometry", *Zhurnal Prikladnoie Spektroskopii,* vol. 46, No. 6, pp. 987-991.

Morimoto, "Gases Released From Silica Glass", *Proceedings of the Illuminating Engineering Institute of Japan,* Tokyo (1989), pp. 16-25.

Shelby, "Reaction of Hydrogen with Hydroxyl-Free Vitreous Silica", *J. Applied Physics,* vol. 51, No. 5, pp. 2589-2593 (1980).

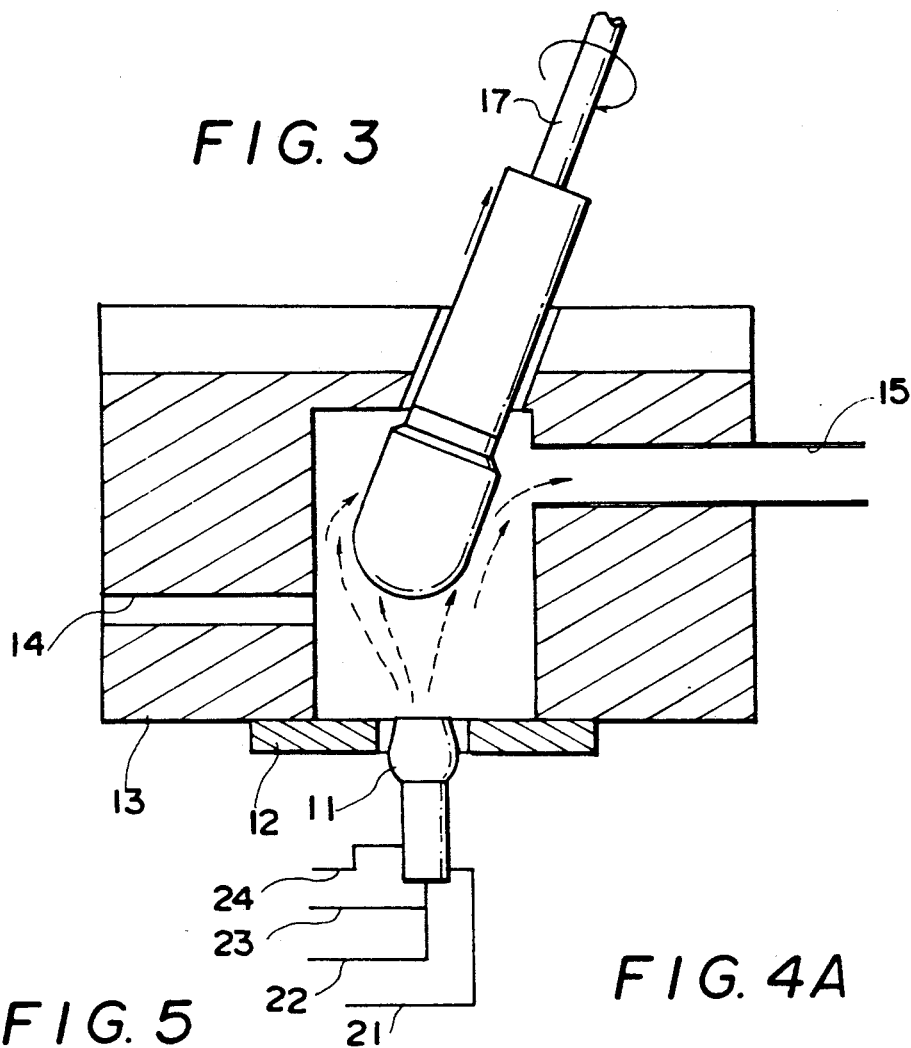
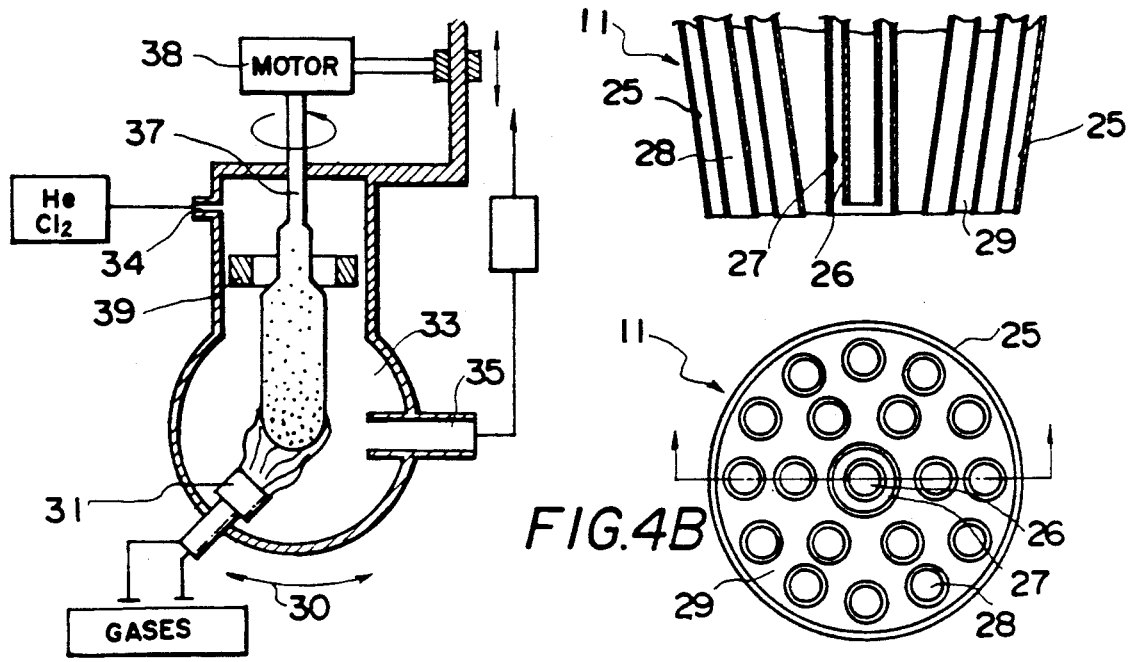

$SiCl_4$, $CH_3Si(OCH_3)_3$ etc, + Ar(He)

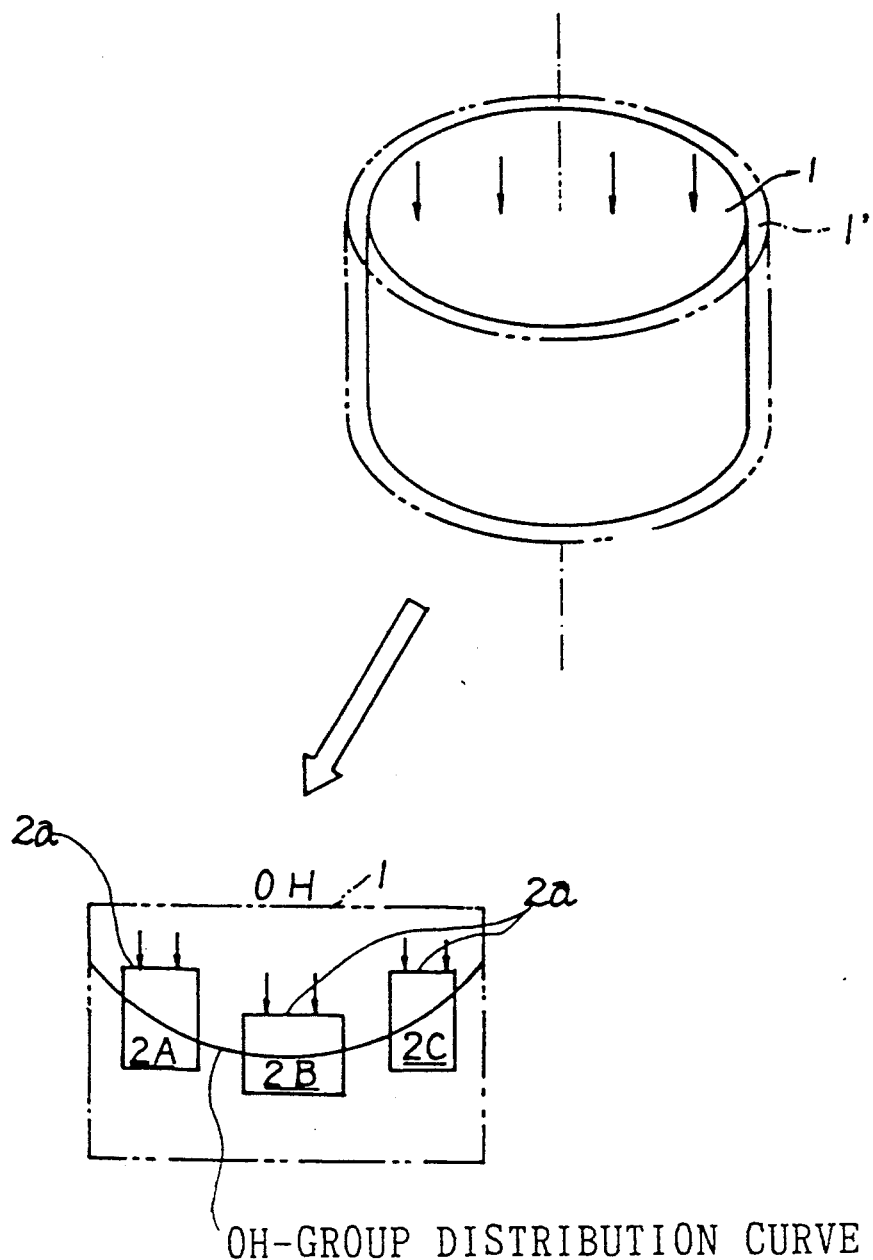

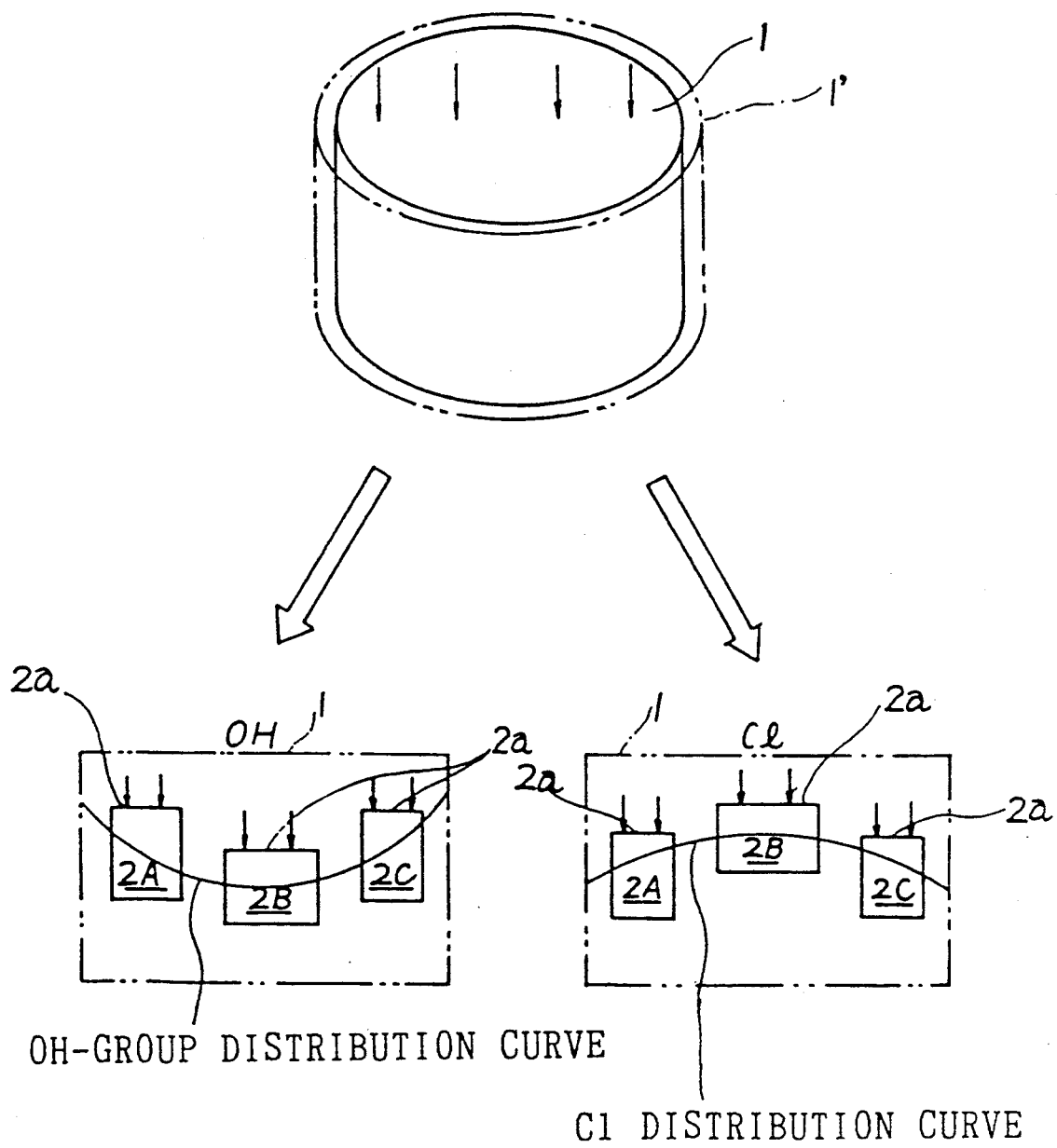

FIG. 9

| | BLANKS: 160mm dia. × 30mm thick | | | | LASER BEAM RESISTANCE | | | | |
|---|---|---|---|---|---|---|---|---|---|
| | OH·group DISTRIBUTION | FICTIVE TEMPERATURE DISTRIBUTION | OH + FICTIVE TEMPERATURE DISTRIBUTION | $H_2$ gas release in vacuum | TRANSMITTANCE | REFRACTIVE INDEX | FLUORECENCE | CRACK | BOND |
| 21 | min ‾‾ 300 ppm<br>$\Delta OH = 30 ppm$ | $\Delta°CFT = 2°C$ | | $5 \times 10^{21}$ (molecules/ml) | ○ | ○ | ○ | ○ | ○ |
| 21' | (B)<br>$\Delta n \approx +3 \times 10^{-6}$ | (C)<br>$\Delta n \approx -3 \times 10^{-6}$ | (A)<br>$\Delta n < 1 \times 10^{-6}$ | $5 \times 10^{19}$ | × | × | △ | △ | × |
| 22 | min ‾‾ 100 ppm<br>$\Delta OH = 30 ppm$ | $\Delta CFT = 2°C$ | | $5 \times 10^{21}$ | ○ | △ | ○ | ○ | ○ |
| 22' | (B)<br>$\Delta n \approx +3 \times 10^{-6}$ | (C)<br>$\Delta n \approx -3 \times 10^{-6}$ | (A)<br>$\Delta n < 1 \times 10^{-6}$ | $5 \times 10^{19}$ | × | × | × | △ | × |
| 23 | min ‾‾ 100<br>$\Delta OH = 150 ppm$ | $\Delta CFT = 2°C$ | | $5 \times 10^{21}$ | ○ | △ | ○ | × | △ |
| | (B)<br>$\Delta n \approx +15 \times 10^{-6}$ | (C)<br>$\Delta n \approx -3 \times 10^{-6}$ | (A)<br>$\Delta n \approx 9 \times 10^{-6}$ | | | | | | |

○ : Excellent
△ : Average
× : Poor

FIG.10

| SAMPLE NO. | INGOT: 200mm dia. × 70mm thick | | | BLANKS: 160mm dia. × 30mm thick | |
| --- | --- | --- | --- | --- | --- |
| | OH-group DISTRIBUTION in TERMS of REFRACTIVE INDEX DISTRIBUTION in 80% CLEAR APERTURE | Cl DISTRIBUTION in TERMS of REFRACTIVE INDEX DISTRIBUTION in 80% CLEAR APERTURE | REFRACTIVE INDEX DISTRIBUTION CONVERSION by OH & Cl DISTRIBUTION in 80% CLEAR APERTURE | FICTIVE TEMPERATURE DISTRIBUTION in TERMS of REFRACTIVE INDEX DISTRIBUTION | FOUND VALUE of REFRACTIVE INDEX DISTRIBUTION |
| 31 | ΔOH=20ppm (B-1) Δn≒+2×10⁻⁶ | ΔCl=10ppm Δn≒+1×10⁻⁶ | (B) Δn≒+3×10⁻⁶ | ΔFT=2°C (C) Δn≒-3×10⁻⁶ | (A) Δn<1×10⁻⁶ |
| 32 | ΔOH=40ppm Δn≒+4×10⁻⁶ | ΔCl=10ppm Δn≒-1×10⁻⁶ | (B) Δn≒+3×10⁻⁶ | ΔFT=2°C (C) Δn≒-3×10⁻⁶ | (A) Δn<1×10⁻⁶ |
| 33 | ΔOH=10ppm Δn≒-1×10⁻⁶ | ΔCl=40ppm Δn≒+4×10⁻⁶ | (B) Δn≒+3×10⁻⁶ | ΔFT=2°C (C) Δn≒-3×10⁻⁶ | (A) Δn<1×10⁻⁶ |
| 34 | ΔOH=20ppm Δn≒-2×10⁻⁶ | ΔCl=10ppm Δn≒-1×10⁻⁶ | (B) Δn≒-3×10⁻⁶ | ΔFT=2°C (C) Δn≒-3×10⁻⁶ | (A) Δn≒6×10⁻⁶ |

OPTICAL MEMBERS AND BLANKS OR SYNTHETIC SILICA GLASS AND METHOD FOR THEIR PRODUCTION

BACKGROUND OF THE INVENTION

The present invention relates to optical members such as lenses, prisms, filters, windows, reflectors, and etalon plates used in various apparatus employed in environments where they are exposed to high-power ultraviolet light having a wavelength of about 360 nm or less, e.g. an excimer laser beam, a YAG fourth harmonics (250 nm) laser beam, or some other high-power ultraviolet laser beam. Further the invention relates to semi-finished products which have not yet been finally polished, and to blanks, and more specifically to lenses, prisms, etc. assembled into a device such as a lithographic laser exposure apparatus for producing highly integrated circuits, a laser fabrication apparatus, a medical apparatus, a nuclear fusion apparatus, or some other apparatus which uses a high-power ultraviolet laser beam. Still further, the invention relates to a method of producing such optical members and/or blanks for such optical members.

In recent years there has been remarkable progress in making large scale integrated circuits (LSIs) finer and in increasing the degree of integration of LSIs. VLSIs having 1,000,000 or more elements per chip are now starting to become prevalent. Along with this progress, lithography techniques for drawing an integrated circuit pattern on a wafer have developed rapidly, and techniques capable of drawing a line with an even narrower width are now being developed. For example, a pattern line having a width of 1 μm which is suitable for 1 M bit DRAM, and a pattern line having a width of 0.8 μm which is suitable for 4 M bit DRAM, are now being developed. These techniques all involve photolithography.

In the field of lithography, there is an urgent need to develop techniques of drawing at submicron scale, i.e. with pattern line widths from 0.5 μm to 0.2 μm, which are suitable for 16 M bit DRAMs to 256 M bit DRAMs which are expected to be realized in the near future. In view of the steady progress of modern optical systems, light sources, photoresists, etc., it is anticipated that photolithography will also play a major role in such ultrafine line width drawing techniques. Indeed, photolithography has various attractive features needed for ultrafine line width drawing because there are, for example, light sources having relatively high brightness, highly sensitive resists, and stable optical materials. However, photolithography has the problem that the resolution is limited by diffraction due to the long wavelengths which are used. To solve this problem, the numerical aperture (NA) of optical systems must be enlarged and/or the wavelength of the light must be shortened.

With respect to enlargement of the numerical aperture of optical systems, numerical apertures of not less than 0.4 are now available, and a lens having a numerical aperture of 0.6 has been developed as a trial product. But, as the numerical aperture is increased, the depth of focus decreases. Consequently, there is a limit to how much the numerical aperture can be increased in order to improve the resolution. Therefore, shortening the wavelength of the light is being considered.

If ultraviolet radiation having a wavelength of 400 nm or less is used with a lens of conventional optical glass, however, the light transmittance rapidly decreases at a working wavelength of 365 nm (i-line). In other words, light absorption and generation of heat due to the light absorption occur, and consequently the focal point of the lens and other properties of the lens are disturbed.

To obviate such difficulties, it has been suggested to use silica glass as the lens material instead of conventional optical glasses. But when normal ultraviolet radiation is passed through silica glass, chromatic aberration occurs because the spectrum of the light is so broad. Thus, it also has been proposed to use a laser beam which oscillates in the ultraviolet range and has a narrow spectrum width as a light source for photolithography.

Among the lasers used for photolithography, excimer lasers are the most practical. An excimer laser is a high-power pulse laser oscillating in the ultraviolet range, e.g. at a wavelength ranging from about 360 nm to about 150 nm. Excimer lasers have the most powerful energy density of known ultraviolet light sources. Various working gas mixtures are possible, including XeF (351 and 353 nm), KrF (248 nm), XeCl (308 nm), ArF (193 nm), etc. Of these, it is preferred for reasons of oscillation efficiency and gas life, to use KrF (248 nm) or ArF (193 nm) which have shorter wavelengths in order to obtain a clearer image at a submicron scale.

It has been found that the irradiation of an excimer laser on silica glass adversely affects the optical properties of the glass. That is to say, applicants have discovered that optical members formed of silica glass are highly subject to optical damage when the silica glass is exposed to an ultraviolet laser beam having a wavelength ranging from 360 nm to 150 nm. Since an excimer laser beam is quite high in power compared to a conventional i-line source or g-line source, etc., as the oscillation wavelength is shortened, even if the optical members for the laser beam are made of silica glass, when the optical members are exposed to the laser beam for an extended period of time, problems arise in that the optical members, including the lenses, are damaged, and their optical properties are changed, e.g., the transmittance decreases, etc. More particularly, irradiation with an ultraviolet laser beam for a long time results, for example, in breaking of the network structure of silica glass, producing an absorption peak at about 215 nm (the so-called E' center) and another absorption band at about 260 nm, thereby decreasing the transmittance in the range from 360 nm to 150 nm and causing optical deterioration. Even high-purity synthetic silica glass is subject to optical damage upon exposure to an ultraviolet laser beam. Such deterioration is not serious with conventional i-line (365 nm) or g-line (436 nm) light sources, but becomes serious for shorter wavelength ultraviolet light beams ranging from 360 nm to 150 nm. Eventually cracks appear. In contrast thereto, other types of light which have longer wavelengths, such as visible light, have a negligible influence on the glass.

One cause of the deterioration in the optical properties is attributed to the presence of metal impurities in the silica glass. Therefore, optical members such as lenses, etc. for a laser beam have been formed of synthetic silica glass made using a highly purified silicon compound, such as $SiCl_4$, as a raw material instead of natural quartz. However, even optical members formed from highly pure silica glass have not given satisfactory results for a high-power laser beam having a short wavelength for several reasons. The first reason is that even if it is intended to make highly pure silica glass, it is impossible to completely eliminate the presence of metal impurities because of problems inherent in the raw material and in the production process of silica glass. A second reason is that synthetic silica glass appears to include various structural defects which decrease the laser beam resistance. These two factors combine to cause the laser resistance to deteriorate. No techniques are known which have been developed to enable an optical member of synthetic silica glass to resist optical deterioration when exposed to short wavelength ultraviolet laser radiation.

It is known from Japanese Patent Publication Sho 40-10228 that colorization of a silica glass article made by melting natural quartz due to the influence of ionizing radiation can be prevented by heating the article in an atmosphere of hydrogen gas to about 400° to 1,000° C., but this publication only teaches occlusion (doping) of hydrogen gas in order to prevent or inhibit solarization to some degree in natural quartz glass. Mere hydrogen doping does not, however, prevent degradation of the optical properties of silica glass optical members subjected to a high-power, ultraviolet light beam like the irradiation of an excimer laser. Thus, this publication does not enable persons skilled in the art to prevent deterioration over time of the optical properties of synthetic glass optical elements exposed to a high-power ultraviolet laser.

It is also known from Japanese Patent Publication Sho 39-23850 that the transmittance of ultraviolet light by a silica glass body can be improved by heat treating the glass body in a hydrogen atmosphere at 950° to 1,400° C. and then heat treating the glass body again in an oxygen-containing atmosphere at 950° to 1,400° C. The purpose of this treatment is to increase the transmittance of ultraviolet light having a wavelength of 300 nm or less by decreasing the metal impurity content which remains in quartz glass and affects the light absorption of the glass. Again this publication provides no information about how to prevent progressive deterioration over time of the optical properties of optical members exposed to ultraviolet radiation. Furthermore, since this prior technique carries out a heat treatment in oxygen after the heat treatment in hydrogen, the initially doped hydrogen is removed by the subsequent oxygen atmosphere heat treatment, thereby eliminating the effect of the hydrogen heat treatment. This document also describes that the heat treatments in the hydrogen atmosphere and in the oxygen atmosphere each give a maximum effect at the temperature of 1,400° C. However, heat treatment at such a high temperature results in contamination of the glass with impurities from the furnace, and thereby produces glass containing significant amounts of impurities which may adversely affect the resistance of the glass to optical deterioration from exposure to high-power, ultraviolet laser light.

U.S. Pat. No. 4,553,995 discloses that hydrogenating an optical fiber or image fiber preform at an elevated temperature also can improve attenuation increases which arise when drawn optical fibers are exposed to gamma-radiation by eliminating bond defects which contribute to bond breakage during the fiber drawing process. Japanese Patent Publication Sho 58-125635 indicates that gamma-radiation resistance of quartz glass optical fibers may be improved by increasing the OH group concentration of the fiber core to greater than 1000 ppm and optionally adding fluorine or chlorine, however no explanation is given of how to accomplish this. In neither of these publications is there any information about resistance to high-power, ultraviolet laser light.

Another problem in the production of optical members for use in very high precision optical devices, such as lithography exposure apparatus for exposing submicron scale integrated circuit patterns, is the attainment of uniform optical properties, particularly a homogeneous refractive index.

In general, optical members of the type to which the present invention applies are manufactured by a process in which the starting glass ingot is remolded into the desired shape, such as a column, disk or sphere, and then annealed (heating followed by slow cooling) to eliminate residual strain. Then the peripheral portion of the blanks is ground off, and finally the blanks are cut, polished and film-coated to fabricate optical members. In this production process, the annealing step is very necessary.

However, even if the annealing speed in the annealing step is slow as possible, it is impossible to get the same cooling rate in both the peripheral zone and the central zone. The cooling rate at the periphery is inevitably faster than at the center. This causes a fictive temperature distribution, the shape of which is a concave curve ascending from the central zone towards the peripheral zone in the cross section of the blanks.

The concept of a fictive temperature distribution is believed to arise from the fact that silica does not undergo an abrupt crystalline transformation with changes in temperature. Instead, the physical properties of the silica change subsequently as a result of a change in temperature, and the amount of change in the physical properties varies depending on the rate of temperature change. If two pieces of silica glass are cooled at different rates, one suddenly and the other gradually, the one which is cooled suddenly will undergo a lesser change in properties than the one which is cooled gradually. In other words, the physical properties such as density, refractive index, etc. of the piece which is cooled suddenly will be more nearly equivalent to the properties at a higher temperature, termed the fictive temperature, even though both pieces are cooled to the same actual temperature. See Brueckner, *J. Non-Crystalline Solids*, Vol. 5, pp. 123-175 (1970).

If a fictive temperature difference is permitted to remain as optical blanks cool to room temperature, then even if a glass blank with ideal uniformity in chemical composition is annealed, the refractive index distribution in the annealed blank inevitably varies with the fictive temperature distribution, resulting in a refractive index distribution having the shape of a concave curve correlated to the fictive temperature distribution.

Therefore, in order to obtain blanks having a uniform refractive index, it is necessary both to make the silica glass highly pure by synthesis and to make the fictive temperature uniform by the heat treatment. Improvements in the uniformity of the temperature, however, are limited so long as the cooling rate is substantially finite, even if improvements in the heat-treating furnace and the heat treatment temperature program are made.

When conventional light, such as a g-line source (436 nm), is used, the presence of such refractive index distributions does not cause serious problems. However, in optical members used for short wavelength laser beams (193 nm to 308 nm), and particularly in laser exposure apparatus for submicron scale lithography having a pattern line width of, for example, 0.5 μm, the refractive index inhomogeneity (δn) needs to be smaller by at least a factor of 10 or more than in the case of visible light. But in optical members fabricated from silica glass blanks having poor optical homogeneity, it is difficult to obtain a highly homogeneous refractive index, and it is therefore impossible to achieve lithography of a fine, clear, submicron scale image.

Thus, in order to facilitate the use of ultraviolet light sources having narrow wavelengths in the range from 360 mn to 150 nm, such as excimer lasers, in high precision optical devices such as exposure apparatus for submicron integrated circuit pattern lithography, there is a need for ways to provide optical members with uniform optical properties including a highly homogeneous refractive index and to prevent the optical properties of such optical members from deteriorating under exposure to light from a high-power ultraviolet light beam like that of an excimer laser, and for optical members having uniform optical properties including a highly homogeneous refractive index whose optical properties do not deteriorate over time when exposed to a high-power, ultraviolet laser beam such as an excimer laser.

SUMMARY OF THE INVENTION

It is an object of the present invention to provide optical members or blanks therefor with improved resistance to optical deterioration upon exposure over time to a high-power, ultraviolet laser beam.

Another object of the invention is to provide a synthetic silica glass optical member or blanks therefor having high resistance to laser damage, which is not attainable with high purity alone.

A further object of the present invention is provide a method of improving the resistance of optical members to damage from exposure over time to high-power, ultraviolet laser light.

A still further object of the present invention is to provide a method of improving the resistance of an optical member to time dependent deterioration of its optical properties under exposure to a high-power ultraviolet laser beam having a wavelength in the range from 360 nm to 150 nm.

An additional object of the invention is to provide optical members or blanks therefor having more uniform optical properties.

It is also an object of the present invention to provide optical members or blanks therefor having a highly homogeneous refractive index distribution.

Additionally it is an object of the present invention to provide optical members or blanks therefor for use with a source of ultraviolet light having a wavelength in the range from 360 nm to 150 nm.

Yet another object of the present invention is to provide a method of producing highly homogeneous synthetic silica glass optical members in which variations of the refractive index, which are apt to be introduced into blanks during the production process starting from highly pure synthetic silica glass, are suppressed.

Still another object of the present invention is to provide a method of producing a synthetic silica glass optical member having the aforementioned characteristics commercially with good reproducibility.

These and other objects of the invention are achieved by providing a synthetic silica glass optical member for use with ultraviolet incident light having a wavelength shorter than about 360 nm, wherein the optical member is made of high-purity synthetic silica glass material which is free from striae in at least one direction corresponding to the incident light and which contains OH groups in an amount of at least about 50 wt. ppm, and the optical member is doped with hydrogen sufficient to inhibit decreases in light transmittance over time due to exposure to the ultraviolet light.

In accordance with preferred aspects of the invention the objects are further achieved by providing an optical member fabricated from highly pure synthetic silica glass starting material containing a high proportion of at least 50 wt. ppm of OH groups by molding the starting glass into desired shape such as column, disk, or sphere, annealing (heating and slowly cooling) the molded blanks to remove the internal strains and to homogenize the properties of the glass, doping the glass with a sufficient amount of hydrogen depending on the wavelength of the light with which the optical member is to be used, grinding off the peripheral portion to form blanks, cutting and polishing the blanks into pieces having a desired size, and subsequently applying a coating to form the optical member.

The objects of the invention are also achieved by providing a blank for a synthetic silica glass optical member for use with incident light having a wavelength shorter than about 360 nm, wherein the blank is made of a heat treated high-purity silica glass material which is free from striae in at least in a direction parallel to the incident light and which contains OH groups, the blank having an OH group concentration distribution in a plane orthogonal to the incident light such that the OH concentration progressively increases from a minimum concentration region to a maximum concentration region without an inflection point so that the blank has an overall refractive index distribution inhomogeneity (δn) in said plane of $2 \times 10^{-6}$ or less.

The objects of the invention are further achieved by providing a blank for a synthetic silica glass optical member for use with incident light having a wavelength shorter than about 360 nm, wherein the blank is made of a high-purity synthetic silica glass material which is free from striae in at least a direction parallel to the incident light, and which contains concentrations of OH groups and chlorine (Cl) distributed therein, the blank having a first refractive index distribution due to a combination of the chlorine concentration distribution and the OH group concentration distribution in a plane orthogonal to the incident light, and the first refractive index distribution is substantially offset by a second refractive index distribution due to a fictive temperature distribution caused during heating/cooling treatment of the blank.

The objects of the invention are additionally achieved by providing a method of producing an optical member or blank for use with light having a wavelength range shorter than about 360 nm comprising the steps of forming a blank from high-purity synthetic silica glass containing OH groups in an amount of at least 50 wt. ppm; removing striae from the blank in at least one direction; removing internal strains from the blank by heating the blank at a temperature of at least 1,000° C., and doping the silica glass with sufficient hydrogen to inhibit decreases in light transmittance over time due to exposure to ultraviolet light.

According to further preferred aspects of the invention the objects are also achieved by a method comprising providing a starting, high purity synthetic silica glass containing at least 50 wt. ppm of OH groups, heat treating the high purity silica glass to eliminate striae one-dimensionally or three-dimensionally, remolding if necessary into the desired shape, annealing the striae free glass to eliminate residual internal strain and to obtain high homogeneity, doping defined concentrations of hydrogen molecules, depending on the wavelength of the ultraviolet light involved, into the resulting high purity homogeneous and striae free silica glass in order to obtain a uniform concentration of doped hydrogen, and grinding off the peripheral portion to form a blank, and if an optical member is to be formed, cutting and polishing the blank into a piece having a desired size, and subsequently applying a coating to form an optical member.

The present invention is the result of extensive experiments, and in part resides in that the optical member is made of high-purity synthetic silica glass which contains OH groups at a concentration of at least 50 wt. ppm, and from which the striae have been removed at least along the direction of incident light, and which is doped with hydrogen. As used herein, the term "hydrogen" is intended to include hydrogen isotopes such as deuterium as well as normal hydrogen. The term "optical member" refers to an optical element such as a lens, prism, filter, reflector, window, or the like which subjects a light beam to a limited number (e.g. 0–4) reflections and/or refractions. Such optical members typically have a thickness, i.e. a dimension transverse to the path traversed by a light beam, which is comparable in magnitude to the length of the path of the light beam through the member. In general, this means that the ratio of the length of the light path through the member to the thickness (i.e. transverse dimension) is not more than 100, preferably not more than 10, and usually not more than about 1.

In some cases, particularly in the case of optical members cut from different portions of larger blanks, it can be very difficult to define the OH group concentration or the Cl concentration with precision, especially in relation to a fictive temperature distribution induced by annealing or other heat treatments. Therefore, in the present application, the semi-finished products or blanks may be distinguished from the finished products or optical members.

BRIEF DESCRIPTION OF THE DRAWINGS

The invention will be described in further detail with reference to the accompanying drawings in which:

FIG. 3 is a schematic representation of a furnace for producing a high-purity synthetic silica glass ingot by the oxy-hydrogen flame or direct method;

FIGS. 4A and 4B are schematic representations of a burner head for use with the furnace of FIG. 3;

FIG. 5. is a schematic representation of a furnace for producing a high-purity synthetic silica glass ingot by the CVD soot remelting method;

FIGS. 8A and 8B are schematic representations of how blanks are formed from glass ingots and optical members can be formed from the resulting blanks;

FIGS. 9 and 10 are diagrams showing how the refractive index distribution varies in accordance with the production process.

DETAILED DESCRIPTION OF PREFERRED EMBODIMENTS

The present inventors have discovered that, as demonstrated by the following examples, an increase in the OH group concentration together with the simultaneous presence of hydrogen dopant enhances the ability of a highly pure, striae free silica glass optical member to resist deterioration in its optical properties over time when exposed to high-power ultraviolet laser radiation. The present inventors have further found that in order to secure the desired laser beam resistance to optical deterioration of a high purity silica glass optical member upon exposure over time to high-power ultraviolet light having a wavelength of about 360 nm or less, the OH group concentration of the optical member should be at least 50 wt. ppm.

How the OH group concentration influences the optical properties is unclear, but without being bound to any particular theory, applicants offer the following possible explanation.

When silica glass is irradiated by a high-power laser beam for a long period of time, the chemical bonds between elements constituting the glass network structure are gradually broken. As a result, the transmittance decreases, absorption bands appear, and in the worst case, cracks occur. Applicants suppose that OH groups which are network terminators relieve stresses in the glass microstructure. It is thought that most of the fragments caused by the breaks of chemical bonds may be repaired by OH groups present in the silica glass or by the presence or diffusion of hydrogen atoms from OH groups, and that if OH groups are present in large amounts, even when chemical bond breakage occurs, the appearance of the absorption band decreases, and as a result the light absorption and the number of broken chemical bonds both decrease.

Therefore, in accordance with the invention, the OH group concentration of the optical member should be increased with decreasing wavelength and increasing energy density of the applied light. For example, if a laser beam having a wavelength of 250 nm or less is used, the OH group concentration is preferably at least 100 wt. ppm.

As for the concentration of the hydrogen dopant, it has been found that when an excimer laser beam having a short wavelength is used, there is an optimum hydrogen concentration. Based on this finding, advantageous hydrogen dopant concentration ranges have been determined for different laser wavelength ranges. Since there is no standard test in the art for determining hydrogen dopant concentration, the hydrogen dopant concentrations in the test samples were measured in two different ways described in detail hereinafter.

Figure 1A:
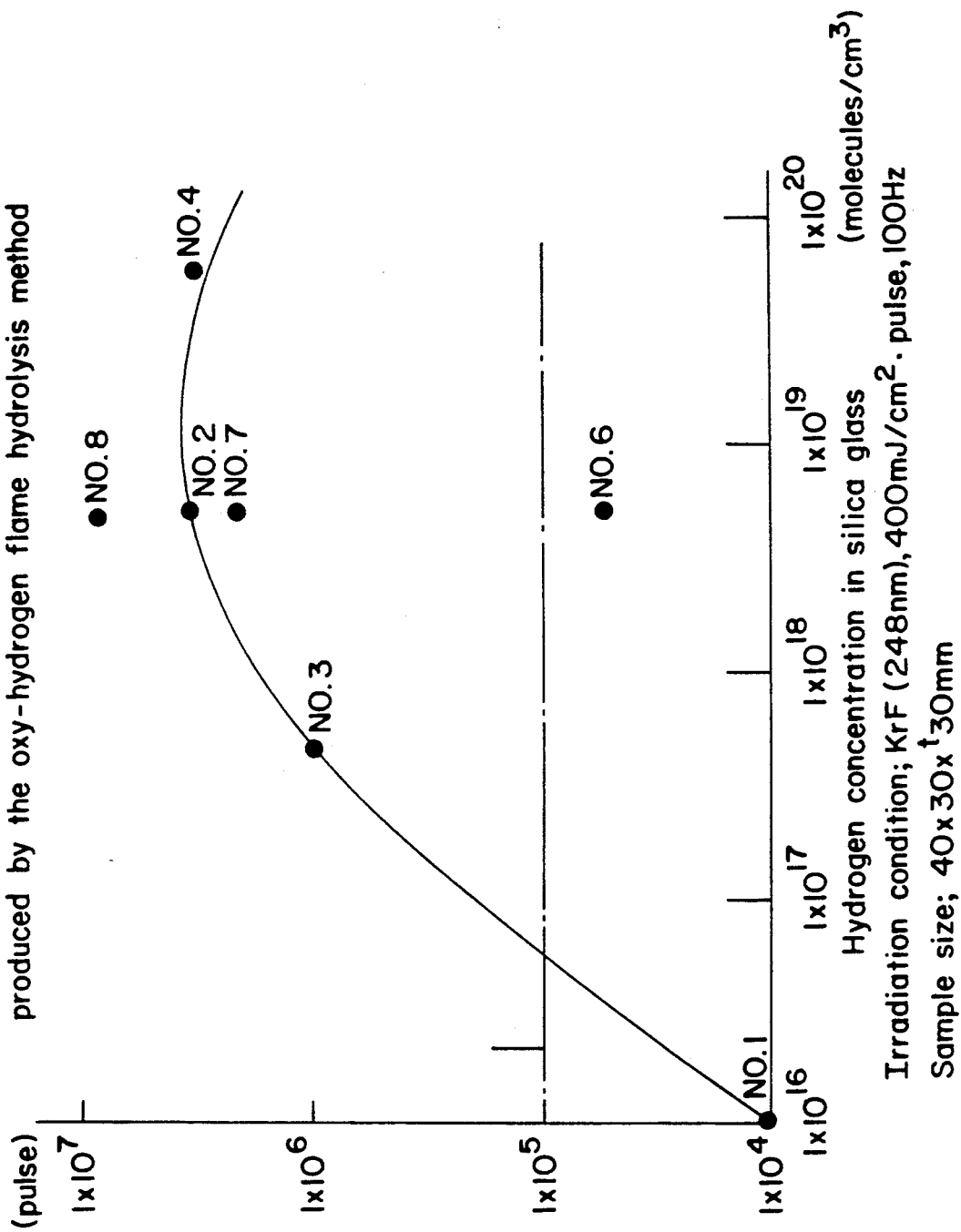
FIGS. 1A, 1B, 2A and 2B are graphs showing the correlation between the hydrogen concentration and the total number of irradiated pulses until the transmittance of 5.8 eV (about 215 nm) light decreases by 2% in 30 mm thick samples whose opposite surfaces were polished and which had been exposed to a KrF excimer laser beam (248 nm) or to an ArF excimer laser beam (193 nm).
Figure 2A:
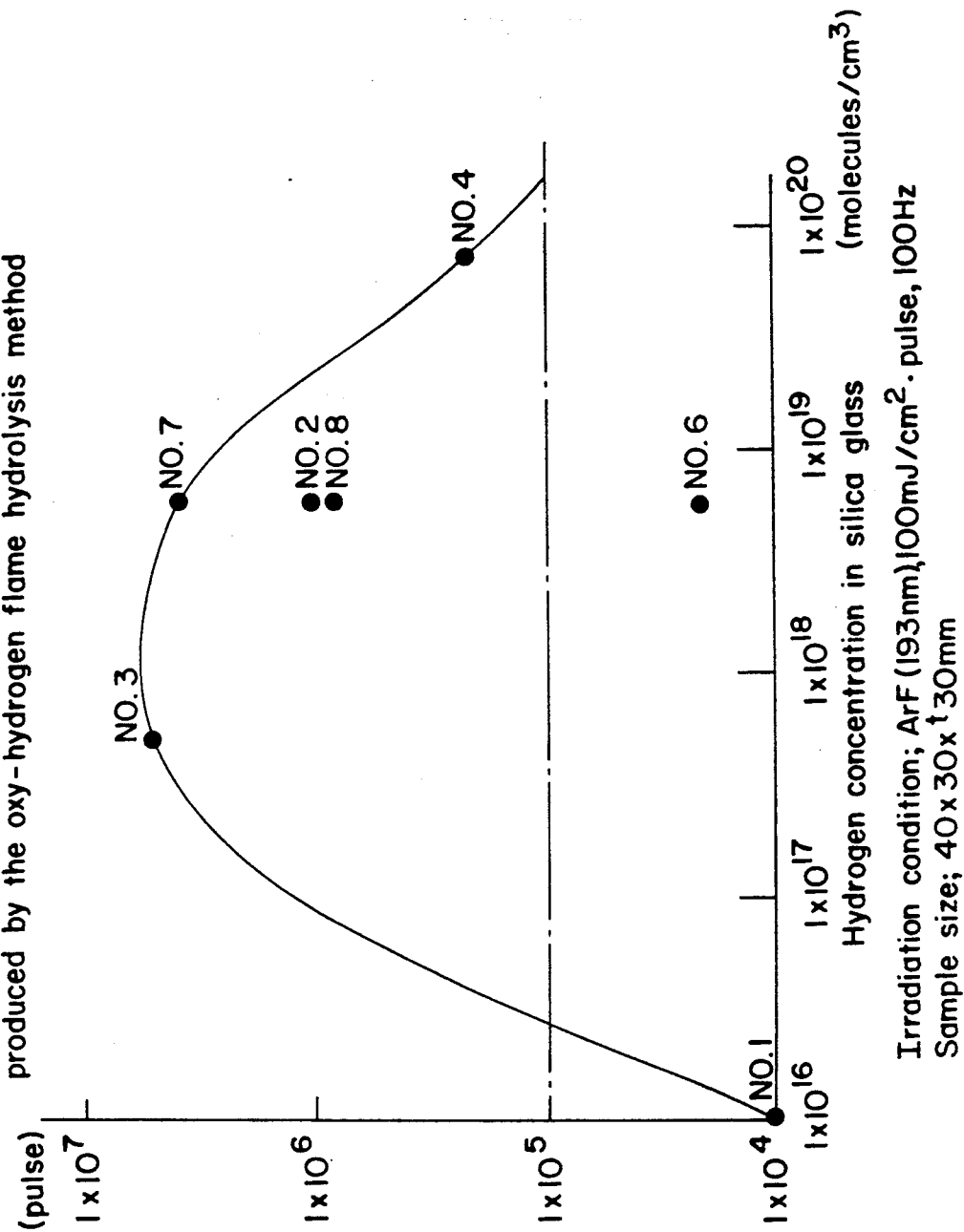

According to the first way of measuring, when the wavelength of a laser beam irradiating an optical member is about 250 nm or longer, it is sufficient to specify that the lower limit of the hydrogen dopant concentration is preferably at least $5 \times 10^{16}$ molecules/cm$^3$ as shown in FIGS. 1A and B. On the other hand, if the optical member is irradiated by a laser beam of shorter wavelength such as an ArF (193 nm) excimer laser, the applicable hydrogen concentration range is narrowed, and the dopant concentration should be in the range from $5 \times 10^{\neq}$ molecules/cm$^3$ to $5 \times 10^{19}$ molecules/cm$^3$ as shown in FIGS. 2A and B.

According to the second way of measuring, the hydrogen dopant molecule concentration is expressed in terms of the number of dopant molecules released per unit area when the temperature of the sample is raised to 1,000° C. in a vacuum. In this case the molecule concentration is specified to be in the range from at least about $1 \times 10^{20}$ molecules/m$^2$ when the wavelength is about 250 nm, and preferably about $1 \times 10^{20}$ to $1 \times 10^{23}$ molecules/m$^2$ when the wavelength is less than about 200 nm.

It is also necessary that the silica glass to be doped with hydrogen be free from striae at least in the direction of the incident light, and preferably in three directions of which one is parallel and two are perpendicular to the incident light. Striae are apt to form during the production of silica glass containing such a large number of OH groups as stated above. In doping striae-containing silica glass with hydrogen, it is difficult to achieve a homogeneous distribution of the hydrogen, and unless the hydrogen is homogeneously distributed, the glass is unlikely to attain the desired degree of resistance to deterioration in its optical properties upon exposure to high-power ultraviolet laser radiation. This is believed attributable to the fact that the local heterogeneous distribution of OH concentration at the striae affects the distribution of hydrogen which depends strongly on the OH concentration. Hence, in striae-containing silica glass, heat treatments such as annealing and hydrogen doping do not produce highly homogeneous silica glass or yield high UV durability.

Accordingly, the present invention calls for the combination of four factors to achieve the desired resistance to optical deterioration: (1) the use of high purity synthetic silica glass, (2) the elimination of striae at least in the incident light direction, (3) the presence of a sufficient OH group concentration, and (4) suitable hydrogen doping. The objects of the invention in its broadest sense are attained basically by satisfying these conditions.

As noted above, it is desired to use the highest possible purity silica glass in the present invention. Since synthetic silica glass is slightly contaminated during heat treatment or other stages of the production of an optical member, however, the term "high purity" should be understood to mean only that the purity is within the following allowable degree of the contamination. It has been found that when the other conditions mentioned above are satisfied, the intended objects can be attained if the impurity content is such that the total amount of Li, Na, and K is 150 ppb or less, the total amount of Mg and Ca is 100 ppb or less, and the total amount of Ti, Cr, Fe, Ni, and Cu is 50 ppb or less. Preferably the impurity content is such that the amounts of metal impurities which may adversely affect the laser beam resistance are Na$\leq$50 ppb, K$\leq$50 ppb, Li$\leq$50 ppb, Mg$\leq$10 ppb, Ca$\leq$10 ppb, Ti$\leq$10 ppb, Cr$\leq$10 ppb, Fe$\leq$10 ppb, Ni$\leq$10 ppb, and Cu$\leq$10 ppb. Thus, although slight contamination may occur during the production process, it is still possible to provide optical members commercially that can attain the desired objects. These metal impurities can be measured with radioactivation analysis or atomic absorption spectrometry.

Synthetic silica is produced in two ways. The first way is the oxy-hydrogen flame hydrolysis method, sometimes referred to as the direct method. A suitable furnace for producing synthetic silica glass ingots according to this method is illustrated in FIG. 3. A burner head 11 extends through an aperture in a plate 12 to the interior of a furnace 13. A window 14 is provided to enable the process to be observed, and a port 15 is provided through which exhaust gases are withdrawn from the furnace chamber. A rotatable glass rod 17 is extended at an angle into the furnace chamber where gases from the burner head can impinge against the end of the rod. Hydrogen gas is introduced through line 21; a raw material gas either SiCl$_4$ or CH$_3$Si(OCH$_3$)$_3$, is introduced to the burner through line 22, and oxygen is introduced into the raw material gas line through line 23 and into the burner head through line 24. The raw material gas is fed to the center port 26 of burner head 11 shown in FIGS. 4A and 4B surrounded by an outer cylinder 25. A premixed flame is supported on a concentric annular tube 27, and oxygen is supplied through a plurality of annularly arranged tubes 28. Hydrogen is introduced through the space 29 between the tubes 28. The raw material is oxidized at the burner head to form droplets of molten silica, which are collected and cooled on the rotating glass rod to form an ingot bar of synthetic silica glass.

Figure 6:
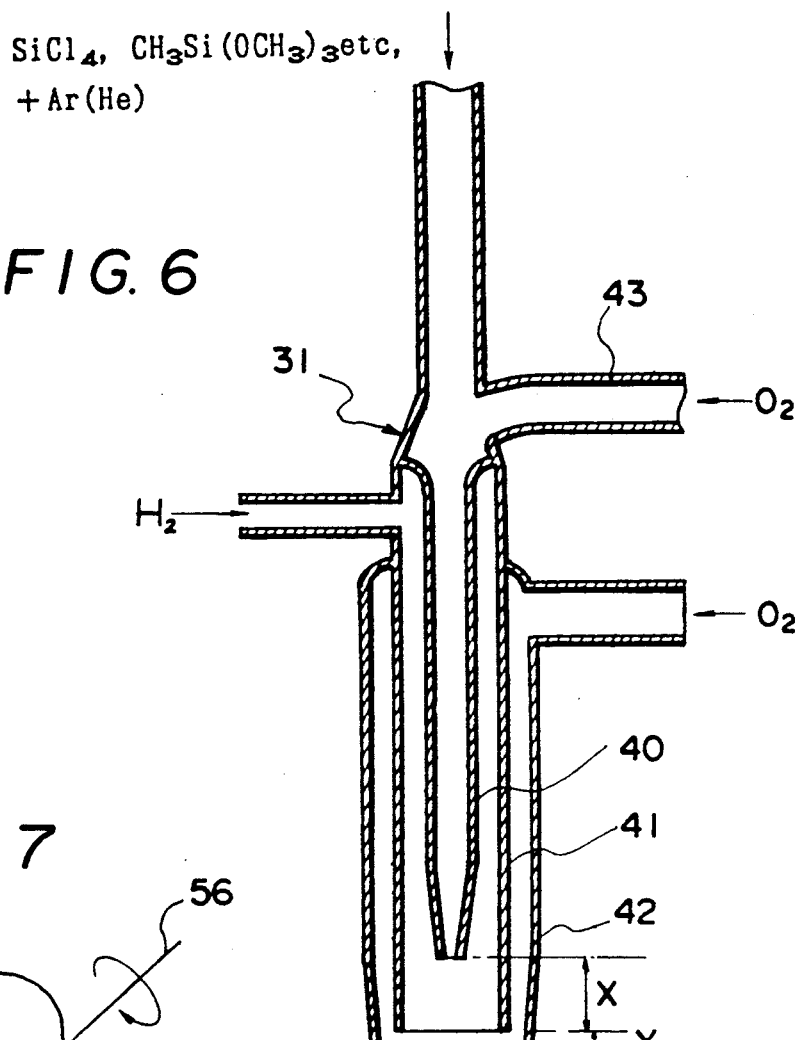
FIG. 6 is a schematic representation of a burner head for use with the furnace of FIG. 5.

The second way is the chemical vapor deposit soot remelting method, also referred to as the CVD method or soot method. A furnace arrangement suitable for carrying out this method is schematically illustrated in FIG. 5. A glass rod 37, rotated by a motor 38 extends into the chamber of a furnace 33 provided with an electric heater 9. A burner 1' is also extended into the furnace 33 so that the gases from the burner can impinge against the end of rod 37. Helium and chlorine gas can be introduced through an inlet 34, and a port 35 is provided for exhausting gases from the furnace. In this method, the SiCl$_4$ or CH$_3$Si(OCH$_3$)$_3$ raw material gas is introduced together with an inert gas such as argon or helium into the center tube 40 of burner 31 illustrated in FIG. 6. Oxygen gas is also introduced into center tube 40 through an inlet 43, and hydrogen gas is introduced through a surrounding tube 41 which projects a distance "X" beyond center tub 40. Additional oxygen is introduced through a concentric outer tube 42 which projects a distance "Y" beyond tube 11'. The feed material is oxidized to form a silica "fog" which is condensed and collected on the end of rod 37 to form a porous silica ingot. As indicated by arrow 30 in FIG. 5, burner 31 is able to swing to adjust the orientation of the burner with respect to the axis of rotation of an ingot forming on rod 37 to facilitate control of the OH and Cl concentration distributions in the ingot.

The main difference between the oxy-hydrogen flame hydrolysis method and the chemical vapor deposit soot remelting method is the temperature of the flame which surrounds the raw material. In the direct method, the surrounding flame is at the very high temperature of the premixed flame. In the CVD soot method, the temperature is the relatively lower temperature of the diffusion flame. The product of the CVD method is sometimes subjected to a dehydration treatment in a chlorine-containing atmosphere at a temperature of about 800° C. for a period of about 10 hours.

Figure 7:
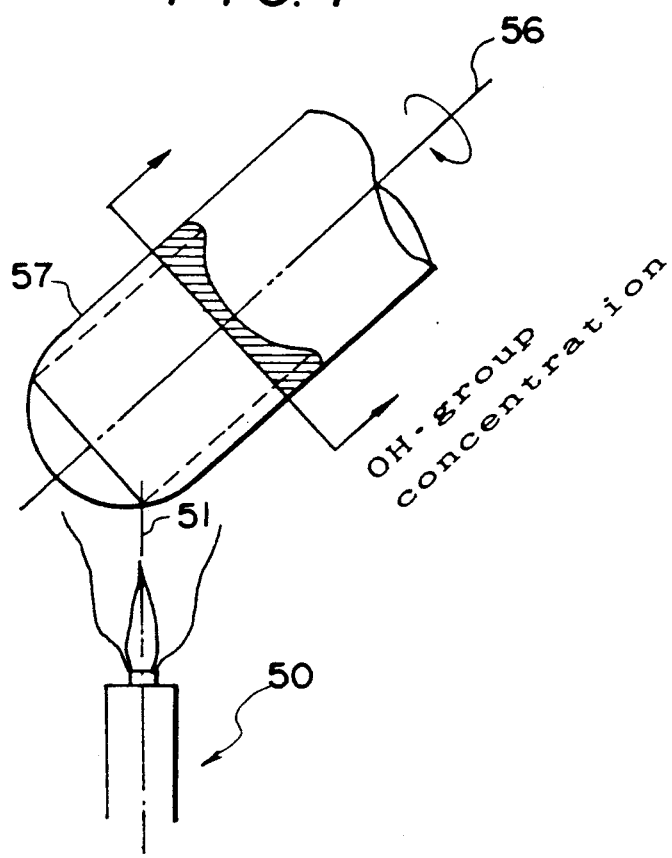
FIG. 7 is an enlarged illustration of the relation between the burner and the forming ingot in FIG. 5.

As shown in FIG. 7, the axis 56 of the ingot 57 which forms is inclined at an angle with respect to the burner head 50. The concentration of OH groups is higher at the center 51 of the burner flame. If the flame center impinges on the edge of the ingot, the OH group concentration of the resulting ingot will be greater at the edge of the ingot than in the center, thus yielding a concave OH group distribution curve. If the flame center is directed at the center of the ingot, then the OH group concentration is higher at the center of the ingot than at the edge, yielding a convex OH group distribution curve.

FIGS. 8A and 8B are schematic representations of how a glass blank 1 is formed by cutting down a glass ingot 1'. As represented at the bottom of each figure, the OH group distribution is not uniform throughout the blank, but instead is lower at the center of the blank than it is at the periphery. This is achieved by focussing the burner on the periphery of the ingot as it forms. An opposite effect, i.e. an OH concentration which is greater in the center than at the periphery can be achieved by focussing the burner on the center of the forming ingot. In FIG. 8B, the chlorine distribution also varies but in an inverse fashion; i.e. the concentration is higher at the center of the blank than it is at the periphery. This is achieved by using a gas mixture which is slightly rich in hydrogen and slightly lean in oxygen. The opposite effect, i.e. a chlorine concentration which is higher at the periphery of the blank than it is in the center can be achieved by using a gas mixture which is slightly lean in hydrogen and slightly rich in oxygen. If the OH concentration distribution is a convex curve (high in the center and low at the outer periphery), then similar chlorine concentration distributions can be achieved by reversing the hydrogen to oxygen ratios. It is generally easier to operate with a gas mixture which is slightly rich in $H_2$ and slightly lean in $O_2$. The gas mixture ratios may be varied progressively as the glass ingot builds up in order to adjust the chlorine concentration distribution. A plurality of optical members 2A, 2B, 2C, etc. can be formed from each blank by conventional cutting, grinding or polishing and surface treating or coating steps.

The OH group concentration distribution and the Cl concentration distribution in the synthetic silica glass ingot can be controlled not only by adjusting the mixing ratio of the raw material gas and the oxy-hydrogen gas but also by adjusting, for example, the shape or the position of the burner of the synthesis apparatus as described above.

In some cases oxygen defects occur in synthetic silica glass starting material due to differences between production methods, for example between the CVD soot method and the oxy-hydrogen flame hydrolysis method, or due to the production conditions. It has been found that if synthetic silica glass having oxygen defects in the network matrix ($SiO_2$) is subjected to hydrogen doping in a heated atmosphere, the oxygen defects are amplified, thereby resulting in faster deterioration of optical properties under laser beam irradiation. Therefore, in a preferred embodiment of the invention, a heat treatment under a prescribed atmosphere is carried out in order to remove oxygen defects in the optical member before the hydrogen doping treatment.

The reason why the presence of oxygen defects adversely affects the optical properties is not known. However, without being bound to any particular theory, applicants may offer the following possible explanation. It is believed that the combined influence of impurities and oxygen defects existing in the glass matrix weakens the chemical bonds between elements constituting the glass matrix in comparison with the chemical bonds between elements of ideal silica glass, and that the bonds between elements thus are more easily broken when exposed to a high-power ultraviolet laser beam for an extended period of time, and therefore changes occur in the structure of the glass matrix, causing the optical properties of the glass to deteriorate.

As used herein, the term "substantially free from oxygen defects" is understood to mean that the concentrations of deficient oxygen atoms and excess oxygen atoms (peroxy-linkages) in the glass matrix measured using the method of Shelby, "Reaction of hydrogen with hydroxyl-free vitreous silica", *J. Appl. Phys.*, Vol. 51, No. 5 (May 1980), pp. 2589-2593, are lower than the limits of detection, and that quantitatively the number of deficient or excess oxygen atoms in the glass matrix ($SiO_2$) is not more than about $10^{17}$ per gram of glass. According to the method of Shelby, the concentration of excess oxygen in the excess oxygen defects is quantitatively measured by determining the difference in infrared absorption of OH groups before and after reacting the excess oxygen with hydrogen at high temperatures of 500 to 850 degrees. The presence of excess oxygen defects can be detected by the decrease in the UV transmission shown by an absorption band at 3.8 eV (325 nm). The concentration of deficient oxygen in the oxygen deficiency defects can be quantitatively measured with vacuum UV as suggested by H. Hosono et al., "Structural Defects and Vacuum UV Absorption in High Purity Synthetic Silica Glasses", *Ceramics*. Vol. 22 (1987), No. 12, pp. 1047-1051, by determining the absorption peak at 7.6 eV (163 nm) which decreases when oxygen deficiency defects react with oxygen gas at high temperatures. See also H. Imai, et al., "UV and VUV Optical Absorption due to Intrinsic and Laser Induced Defects in Synthetic Silica Glasses", *The Physics and Technology of Amorphous SiO_2*, LesArcs, France (June 29-July 3, 1987). Oxygen deficiency defects can also be detected by photoluminescence emitted at about 4.3 eV when a sample is irradiated with a 5 eV (248 nm) KrF excimer laser.

In accordance with a further preferred embodiment of the invention, an optical member is provided which has high optical homogeneity in spite of the fictive temperature distribution which arises during heat treatment of the glass from which the member is formed. In this preferred embodiment, the refractive index is made uniform by compensation or mutual offsetting between two factors which tend to produce nonuniform distributions of the refractive index. The first is the fictive temperature distribution which inevitably occurs during the annealing process, and the second is a distribution of the OH concentration which is produced in a controlled manner by adjusting the distribution of OH groups.

Although a uniform refractive index theoretically could be attained by achieving a uniform fictive temperature distribution, in practice it is not possible to achieve a uniform fictive temperature distribution. Since, as stated above, heating/cooling treatment of a highly pure synthetic silica glass mass having a uniform composition results in a refractive index distribution which varies depending on the fictive temperature distribution, a refractive index distribution is produced corresponding to a curve which ascends successively from the central portion of the glass mass toward the peripheral portion, i.e. an axially symmetrical refractive index distribution which has a concave shape as shown by the curves (C) in FIG. 9.

In order to offset the refractive index distribution (C) induced by the fictive temperature distribution and produce a uniform overall refractive index distribution as shown at (A) in FIG. 9, it is necessary that the silica glass mass to be annealed have an OH group concentration distribution which produces an opposite refractive index distribution, i.e. an axially symmetrical refractive index distribution having a convex shape decreasing from a central zone toward peripheral zone as shown by the curves (B) in FIG. 9. The OH-group concentration in silica glass can be measured by IR absorption spectrophotometry according to the method of D. M. Dodd et. al., "Optical Determinations of OH in Fused Silica", *J. Applied Physics*, Vol. 37, No. 10, p. 3911 (1966). Since there is an inverse correlation between the OH group concentration distribution and the refractive index distribution, by selecting a concave OH group concentration gradient, a refractive index distribution (B) is produced that can offset the refractive index distribution (C) induced by the aforementioned fictive temperature distribution. This compensation or offsetting enables the desired effects of the present invention to be achieved.

Additionally, since the laser beam resistance depends not only on the concentration distribution of OH group but also on the OH group content as described above, unless the glass has a sufficient OH group content as well as an appropriate OH group concentration distribution, optical members having both the desired optical uniformity and resistance to optical deterioration cannot be obtained.

Although the present invention basically makes use of the OH group concentration distribution to effectively compensate for the refractive index distribution induced by the fictive temperature distribution, since in many cases the synthetic silica glass used in the present invention is made from high purity silicon tetrachloride raw material, some quantity of Cl is also present together with OH groups. Consequently, it may be difficult to suppress variations in the refractive index, i.e to achieve a uniform refractive index, without also taking into account the influence of the Cl. The Cl concentration in silica glass can be measured by the nephelometric method for determining chlorine as silver chloride. Accordingly, in a further preferred embodiment of the present invention, three major factors are considered which influence the refractive index, namely the fictive temperature, the OH concentration and the Cl concentration. Through controlling the distribution of each of these three factors, variations in the overall refractive index can be suppressed more effectively. The present invention provides blanks in which the OH group concentration and the Cl concentration both vary progressively from the central zone toward the peripheral zone without any inflection point as shown in FIG. 10.

As noted above, since heating/cooling treatment of synthetic highly pure silica glass having a uniform composition results in variation of the refractive index distribution depending on the fictive temperature distribution, annealing causes a refractive index distribution along a curve ascending progressively from the central zone of the glass mass toward the peripheral zone, i.e. an axially symmetrical refractive index distribution having a concave shape as shown by curves (C) in FIG. 10. Therefore, in order to obtain a uniform refractive index as shown in (A) by offsetting the distribution (C) induced by the fictive temperature distribution, it is necessary that the silica glass mass to be annealed have an opposite refractive index distribution which is determined by the OH group concentration and the Cl concentration distribution, i.e. an axially symmetrical refractive index distribution having a convex shape descending from the central zone toward peripheral zone as shown by the curves (B) for Sample Nos. 31 through 33 in FIG. 10. Accordingly, in blanks of this embodiment of the invention, the OH group concentration and Cl concentration are varied successively without any inflection point from the central zone to the peripheral zone, thereby making the refractive index distribution as viewed in a sectional plane through the glass member to have the shape shown in (B).

As can be seen from FIG. 10, there is an inverse correlation between the OH group concentration distribution and the refractive index distribution. On the other hand, there is a direct correlation between the Cl concentration distribution and the refractive index distribution. Therefore, by selecting a combination of the OH group concentration distribution and the Cl concentration distribution such that the curves identified as No. 31, No. 32 and No. 33 in FIG. 10 are formed, it is possible to produce a refractive index distribution (B) which compensates for or offsets the refractive index distribution (C) caused by fictive temperature distribution. Thus, blanks can be provided in which the refractive index inhomogeneity ($\delta n$) is $2\times 10^{-6}$ or less, and which are very suitable for optical members to be used for a short-wavelength laser beam, particularly an excimer laser beam.

Further details of the invention will be apparent from a consideration of the following, non-limiting examples.

EXAMPLES

I. Examples of Synthetic Silica Glass and Method for Its Production

In order to produce high-purity synthetic silica glass, silicon tetrachloride raw material was distilled to remove impurities and stored in a stainless steel container lined with a fluorocarbon resin ("DuPont Teflon"). The resulting high-purity silicon tetrachloride was used to synthesize high-purity silica glass ingots by the oxyhydrogen flame hydrolysis method and the CVD soot method.

Each of the ingots which were produced had strong striae, and consequently exhibited a high birefringence. In order to render the ingots suitable for use as optical members, the ingots must be annealed or heat treated to remove the striae and reduce the birefringence. Generally the birefringence should be reduced to 5 nm/cm or less.

The refractive index inhomogeneity ($\delta n$) of each of the ingots was measured with an interferometer using a He-Ne laser having a wavelength of 633 nm and found to be around $2\times 10^{-4}$.

Then the ingots were homogenized by a floating zone method as described in U.S. Pat. Nos. 2,904,713; 3,128,166; 3,128,169 and 3,485,613. The ingots were subjected to heat and elongated to form silica glass bars having a desired diameter. Each of the bars was placed on a lathe to be held. Then the bar was heated above the softening point of the silica glass with a multi-port gas burner. During the softening process, the bar was twisted until the striae in the bar were removed to yield a bar which is free of striae in three dimensions.

The striae-free bars were heat formed into arbitrary shapes to obtain ingots which were free from striae in three dimensions and in which the refractive index inhomogeneity (βn) was suppressed to not more than $2 \times 10^{-6}$.

The ingots were placed in a very clean electric furnace having a tungsten heater in a stainless steel jacket, and were degassed under a vacuum atmosphere of less than 0.1 atmosphere pressure while being heated at 200° to 1,000° C., preferably 600° to 800° C., and then cooled. For convenience, this treatment will be referred to hereinafter as degassing. The degassed ingots were then subjected to heating/cooling under an inert gas atmosphere at standard pressure in the same electric furnace at about 1,100° C. to carry out the annealing treatment, thereby producing ingots corresponding to the blanks of the present invention. The reason why the heat treatment temperature for the annealing was about 1,100 ° C. was that the strain point of synthetic silica glass was considered to be about 1020° C. and the annealing point was considered to be about 1120° C., and it was believed very effective to carry out the heat treatment in the temperature range including the glass transition range from 1020° C. to 1120° C. in order, for example, to remove internal strains.

The contents of alkali metal elements, Li, Na, and K; alkaline earth metal elements, Mg and Ca, and transition metal elements, Ti, Cr, Fe, Ni, and Cu of the heat-treated ingots were analyzed, and the values which were obtained are listed under Nos. 1 and 11 in the following Table 1.

TABLE 1

| | Analysis of Impurities (wt. ppb) | | |
|---|---|---|---|
| | Test No. | | |
| | No. 1, 11 | No. 18 | No. 6 |
| Li | <50 | <50 | <50 |
| Na | <50 | 360 | 110 |
| K | <50 | 220 | 50 |
| Mg | <10 | 120 | 50 |
| Ca | <10 | 80 | 40 |
| Ti | <10 | <10 | <10 |
| Cr | <10 | 60 | 30 |
| Fe | <10 | 240 | 40 |
| Ni | <10 | <10 | <10 |
| Cu | <10 | <10 | <10 |

In none of the ingots was the total content of Li, Na, and K over 150 ppb; the total content of Mg and Ca over 100 ppb, or the total content of Ti, Cr, Fe, Ni, and Cu over 50 ppb. This shows that the high-purity was retained.

The glass was cut into pieces of desired size, and the hydrogen molecule concentration was measured. As noted above, no standard method has been established for measuring the hydrogen molecule concentration of glass blanks, but two methods are known. The first is described in Khotimchenko, et al., "Determining the Content of Hydrogen Dissolved in Quartz Glass Using the Methods of Raman Scattering and Mass Spectrometry", *Zhurnal Prikladnoi Spektroskopii*, Vol. 46, No. 6, pp. 987 to 991, June 1987 wherein the ratio of the scattering intensity I at 4135 cm$^{-1}$ and 800 cm$^{-1}$ is determined by "an argon laser Raman scattering spectrophotometer," and the hydrogen concentration C (H$_2$ molecules/cm$^3$ glass) is calculated according to the following equation:

$$C = [I\ (4135\ cm^{-1})]/[I\ (800\ cm^{-1})] \times k$$

where $k = 1.22 \times 10^{21}$ (constant).

In the second method a sample is prepared by cutting the glass blank into a $40 \times 20 \times t\ 1$ mm piece and polishing the opposite surfaces. Then, following the procedure of Y. Morimoto, "Gases Released from Silica Glass", *Proceedings of the Illuminating Engineering Institute of Japan*, Tokyo, (1989), pp. 16-25, the sample is placed inside a silica glass chamber in a furnace which was connected to a pair of turbo-molecular pumps to produce a vacuum atmosphere down to $1 \times 10^{-7}$ Pa, the temperature is raised to 1,000° C. at a heating rate of 4° C./min and maintained at 1,000° C. for 2 hours. During the heating the total pressure of the evacuated gases is measured with nude type pressure gages, and the partial pressure with mass spectrometers. The released gases are introduced into a quadruple type gas mass spectrometer so that the released gas amounts are directly measured. The amount of each gas released is calculated as an area which is the product of measured pressure and time. The gas content in the thin specimen is expressed in terms of gas volume per unit area of the specimen.

In this example, measurements were carried out by both methods using an Ar Laser Raman Spectrometer, Type NR-1100 manufactured by Japan Spectroscopic Co., Ltd. and a mass spectrometer arrangement as described by Morimoto.

Then each sample obtained from blanks of high-purity synthetic silica glasses produced by the oxyhydrogen flame hydrolysis method (direct method) and the CVD method (soot method) which had been annealed to remove residual strain from the silica glass, was cut into pieces having a size of $40 \times 30 \times t\ 30$ mm and the opposite surfaces were fine polished to prepare from each sample at least two quasioptical member test pieces for the excimer laser exposure test.

Figure 1B:
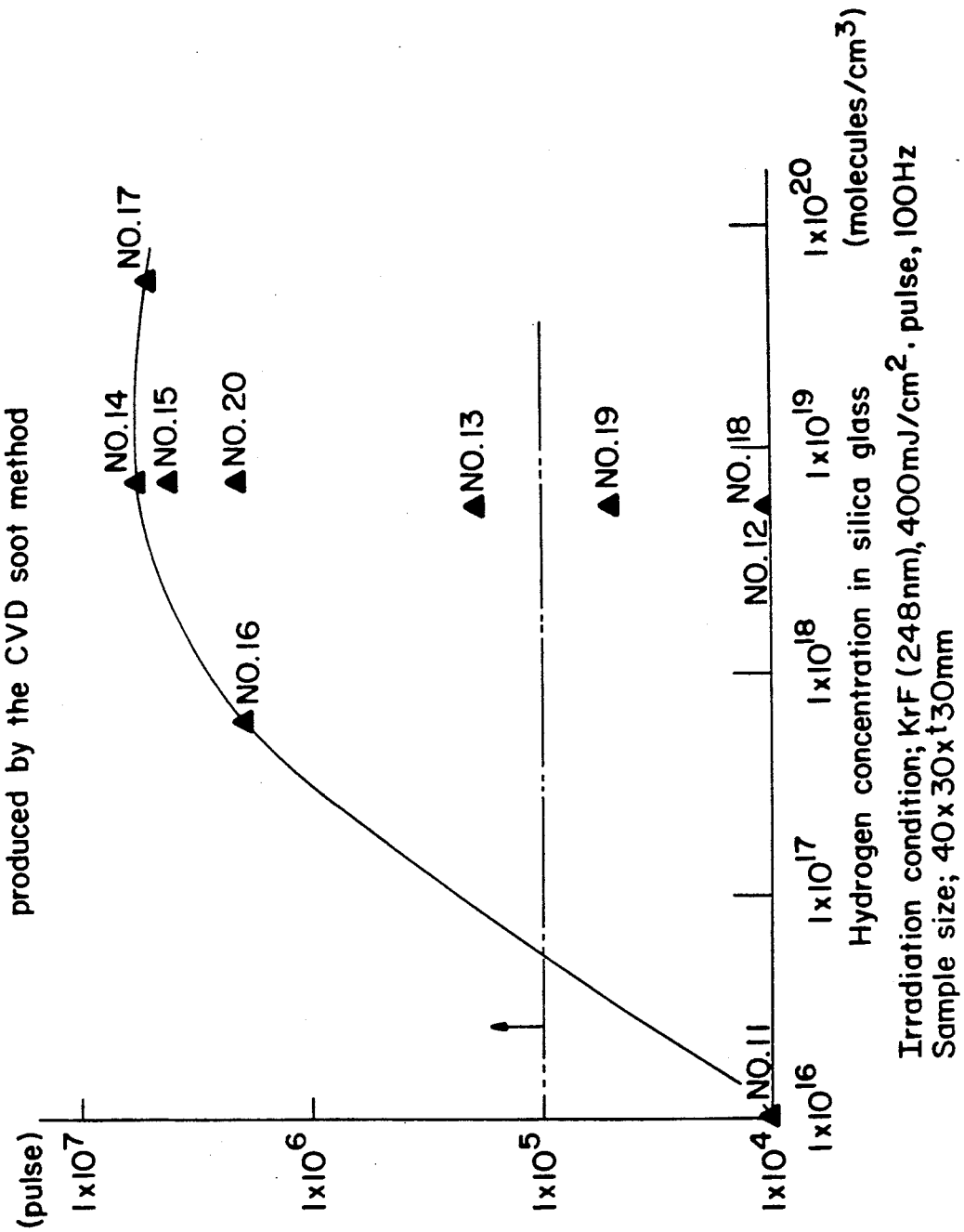

One piece of each sample was irradiated with a KrF excimer laser (248 nm) at a pulse energy density of 400 (mJ/cm$^2$ pulse) and a frequency number of 100 Hz while the change in the transmittance of 5.8 eV (about 215 nm) light over time was measured with a UV spectrophotometer for detecting the E' center absorption band. The number of irradiated pulses until the transmittance in each sample decreased by 2% was determined. The relation between the hydrogen concentration and the total number of irradiated pulses until the transmittance decreased by 2% is plotted in FIGS. 1A or 1B for each sample.

The second piece of each sample was irradiated with an ArF excimer laser (193 nm), which has a shorter wavelength than a KrF excimer laser (248 nm). The total number of irradiated pulses until the transmittance decreased by 2% was measured with the pulse energy density being 100 (mJ/cm$^2$ pulse) and other conditions being the same as above. The relation between the number of irradiated pulses until the transmittance decreased by 2% and the hydrogen concentration is plotted in FIGS. 2A or B for each sample.

It was found that the resistance to optical deterioration was not satisfactory despite the high purity of the test pieces. As can be seen, the number of irradiated total pulses until the transmittance decreases by 2% in each of the samples of synthetic silicon glass (Sample Nos. 1 and 11) was less than $1 \times 10$ (pulses) which represents a practical minimum working limit which an optical member ought to be able to withstand.

The effect of hydrogen doping on the resistance of glass to optical deterioration upon exposure to a laser beam was also investigated using annealed ingots which had been doped with hydrogen in a pressurized atmosphere. In order to dope the ingots with hydrogen, the degassed ingots were annealed under a hydrogen atmosphere at a pressure of about 10 kg/cm² in a clean electric furnace having a stainless steel jacket, and then the hydrogen concentration of the resulting ingots and the total number of irradiated pulses until the transmittance decreased by 2% at 5.8 eV (about 215 nm) were measured. The relation between the hydrogen concentration and the total number of irradiated pulses until the transmittance decreased by 2% was plotted in FIGS. 1A and B and FIGS. 2A and B. The results showed that the ultraviolet laser beam resistance of test pieces prepared from the high-purity ingot produced by the flame hydrolysis method was superior. For Sample No. 12 prepared by the CVD soot method, the total number of irradiated pulses was not over $1 \times 10^5$ (pulses), i.e. the desired minimum laser beam resistance could not be obtained. In contrast thereto, for Sample No. 2 prepared by the oxy-hydrogen flame hydrolysis method, the total number of irradiated pulses was not less than $1 \times 10^6$ (pulses), i.e. very advantageous laser beam resistance could be obtained.

The differences in physical properties between the ingot produced by the flame hydrolysis method and the ingot produced by the CVD soot remelting with dehydration method were determined, and it was found that the OH group concentration of the ingot produced by flame hydrolysis was considerably higher than the OH group concentration of the ingot produced by the CVD soot method. The OH group contents in the ingots were determined using an NIR Spectrophotometer, Type UVIDEC-590, manufactured by Japan Spectroscopic Co., Ltd. The ingots prepared by the oxy-hydrogen flame hydrolysis method were found to have an OH group content of 800 wt. ppm, while the ingots prepared by the CVD soot method had an OH group content of 5 wt. ppm or less. Therefore, ingots having higher OH group concentrations (Sample Nos. 14, 15 and 16) were produced by the CVD soot method by adjusting the oxy-hydrogen flame conditions, and the relation between OH group concentration and resistance to ultraviolet laser damage was investigated. It was found that the laser beam resistance depends on the OH group concentration and that the laser beam resistance was poor unless the OH group concentration was at least 50 ppm, preferably at least 100 ppm.

Further, the effect of hydrogen doping concentration was tested at various hydrogen pressure conditions. It was found that particularly when an excimer laser beam of high energy density and short wavelength was used, that good laser beam resistance depended on the presence of a sufficient hydrogen doping concentration to inhibit decreases in light transmittance over time.

Oxygen deficiency and excess oxygen defects were determined by measuring the respective absorption bands using an a UVIDEC-610 Ultraviolet Spectrophotometer and a VuV-200 Vacuum Ultraviolet Spectrophotometer, both manufactured by Japan Spectroscopic Co., Ltd.

The characteristic values of the test samples are shown in the following Tables 2A and 2B:

TABLE 2A

| Physical Properties of Samples Made By the Flame Hydrolysis Method | | | | | | | |
|---|---|---|---|---|---|---|---|
| | Experiment No. | | | | | | |
| | 1 | 2 | 3 | 4 | 6 | 7 | 8 |
| OH Concentration (ppm) | 800 | 800 | 800 | 800 | 800 | 400 | 1200 |
| Purity Grade | High | High | High | High | Low | High | High |
| Transmission before irradiation @ 215 nm /30 mm (%) | >99.9 | >99.9 | >99.9 | >99.9 | 99.5 | >99.9 | >99.9 |
| $H_2$ gas release in vacuum @ 1000° C. (molecules/m²) | $<1 \times 10^{19}$ | $3 \times 10^{21}$ | $3 \times 10^{20}$ | $2 \times 10^{22}$ | $4 \times 10^{21}$ | $3 \times 10^{21}$ | $4 \times 10^{21}$ |
| $H_2$ concentration (molecules/cm³) | $<1 \times 10^{16}$ | $4 \times 10^{18}$ | $4 \times 10^{17}$ | $4 \times 10^{19}$ | $4 \times 10^{18}$ | $4 \times 10^{18}$ | $4 \times 10^{18}$ |
| Oxygen deficiency type defects | None | None | None | None | None | None | None |
| Excess oxygen type defects | None | None | None | None | None | None | None |
| KrF excimer laser durability | Poor | Excellent | Excellent | Excellent | Poor | Excellent | Excellent |
| Pulses @ 215 nm until 2% transmission loss | $1 \times 10^4$ | $3 \times 10^6$ | $1 \times 10^6$ | $3 \times 10^6$ | $5 \times 10^4$ | $2 \times 10^6$ | $8 \times 10^6$ |
| Relative fluorescence intensity @ 650 nm | 100 | 1 | 1 | 1 | 30 | 1 | 1 |
| ArF excimer laser durability | Poor | Excellent | Excellent | Average | Poor | Excellent | Excellent |
| Pulses @ 215 nm until 2% transmission loss | $1 \times 10^4$ | $1 \times 10^6$ | $5 \times 10^6$ | $2 \times 10^5$ | $2 \times 10^4$ | $4 \times 10^6$ | $8 \times 10^5$ |
| Relative fluorescence intensity @ 650 nm | 100 | 1 | 1 | 10 | 50 | 1 | 1 |

TABLE 2B

| Physical Properties of Samples Made By the CVD Soot Method | | | | | | | | | | |
|---|---|---|---|---|---|---|---|---|---|---|
| | Experiment No. | | | | | | | | | |
| | 11 | 12 | 13 | 14 | 15 | 16 | 17 | 18 | 19 | 20 |
| OH Concentration (ppm) | <5 | <5 | 50 | 200 | 400 | 200 | 200 | 200 | 200 | 200 |
| Purity Grade | High | High | High | High | High | High | High | Low | High | High |
| Transmission before irradiation @ 215 nm | >99.9 | >99.9 | >99.9 | >99.9 | >99.9 | >99.9 | <— | 99.0 | >99.9 | >99.9 |

TABLE 2B-continued

Physical Properties of Samples Made By the CVD Soot Method

| | Experiment No. | | | | | | | | | |
|---|---|---|---|---|---|---|---|---|---|---|
| | 11 | 12 | 13 | 14 | 15 | 16 | 17 | 18 | 19 | 20 |
| $\tau 30$ mm (%) | | | | | | | | | | |
| $H_2$ gas release in vacuum @ 1000° C. (molecules/m$^2$) | $<1 \times 10^{19}$ | $4 \times 10^{21}$ | $4 \times 10^{21}$ | $3 \times 10^{21}$ | $4 \times 10^{21}$ | $4 \times 10^{20}$ | $2 \times 10^{22}$ | $3 \times 10^{21}$ | $4 \times 10^{21}$ | $4 \times 10^{21}$ |
| $H_2$ concentration (molecules/cm$^3$) | $<1 \times 10^{16}$ | $4 \times 10^{18}$ | $4 \times 10^{18}$ | $5 \times 10^{18}$ | $4 \times 10^{18}$ | $5 \times 10^{17}$ | $4 \times 10^{19}$ | $4 \times 10^{18}$ | $4 \times 10^{18}$ | $4 \times 10^{18}$ |
| Oxygen deficiency type defects | None | None | None | None | None | None | None | None | Defect | None |
| Excess oxygen type defects | None | None | None | None | None | None | None | None | None | None |
| KrF excimer laser durability | Poor | Poor | Average | Excellent | Excellent | Excellent | Excellent | Poor | Poor | Excellent |
| Pulses @ 215 nm until 2% transmission loss | $1 \times 10^4$ | $1 \times 10^4$ | $2 \times 10^5$ | $5 \times 10^6$ | $4 \times 10^6$ | $2 \times 10^6$ | $5 \times 10^6$ | $1 \times 10^4$ | $5 \times 10^4$ | $2 \times 10^6$ |
| Relative fluorescence intensity @ 650 nm | 100 | 1000 | 10 | 1 | 1 | 1 | 1 | 1000 | 1 | 1 |
| ArF excimer laser durability | Poor | Poor | Average | Excellent | Excellent | Excellent | Average | Poor | Poor | Excellent |
| Pulses @ 215 nm until 2% transmission loss | $1 \times 10^4$ | $1 \times 10^4$ | $4 \times 10^5$ | $3 \times 10^6$ | $2 \times 10^6$ | $5 \times 10^6$ | $2 \times 10^5$ | $1 \times 10^4$ | $3 \times 10^4$ | $2 \times 10^6$ |
| Relative fluorescence intensity @ 650 nm | 100 | 1000 | 5 | 1 | 1 | 1 | 10 | 1000 | 1 | 1 |

When the differences between the chemical properties of the high-purity ingots prepared by the oxy-hydrogen flame hydrolysis method and the CVD soot method were investigated, the OH group content of the ingots prepared by the oxy-hydrogen flame hydrolysis was found to be very high. Therefore, when high-purity synthetic silica glass was produced by the CVD soot method, the mixing ratio of the silicon tetrachloride raw material gas and the oxy-hydrogen flame was adjusted as needed to produce ingots containing OH groups in amounts of 50 wt. ppm, 200 wt. ppm, and 400 wt. ppm, (Sample Nos. 13, 14, and 15) respectively. After the resulting ingots were degassed as described above, they were subjected to a simultaneous annealing/hydrogen doping treatment. The hydrogen concentration of the resulting ingots and the total number of irradiated pulses until the transmittance decreased by 2% were measured as described above.

For ingots having an OH group content of 50 wt. ppm irradiated with a KrF excimer laser, the total number of irradiated pulses was about $1 \times 10^5$ to $1 \times 10^6$ (pulses), i.e. the minimum laser beam resistance could be obtained. For ingots having an OH group content of not less than 200 wt. ppm irradiated with a KrF or an ArF excimer laser, the total number of irradiated pulses was not less than $1 \times 10^6$ (pulses), i.e. very advantageous laser beam resistance could be obtained. These tests show that the ability to resist optical deterioration from exposure to a short wavelength ultraviolet laser beam depends on the OH group content in the presence of hydrogen gas.

Further, when high-purity ingots having an OH group content increased to 1,200 wt. ppm (Sample No. 8) were produced by the flame hydrolysis method, and were heat-treated in the same manner as above, very favorable laser beam resistance could be obtained.

Figure 2B:
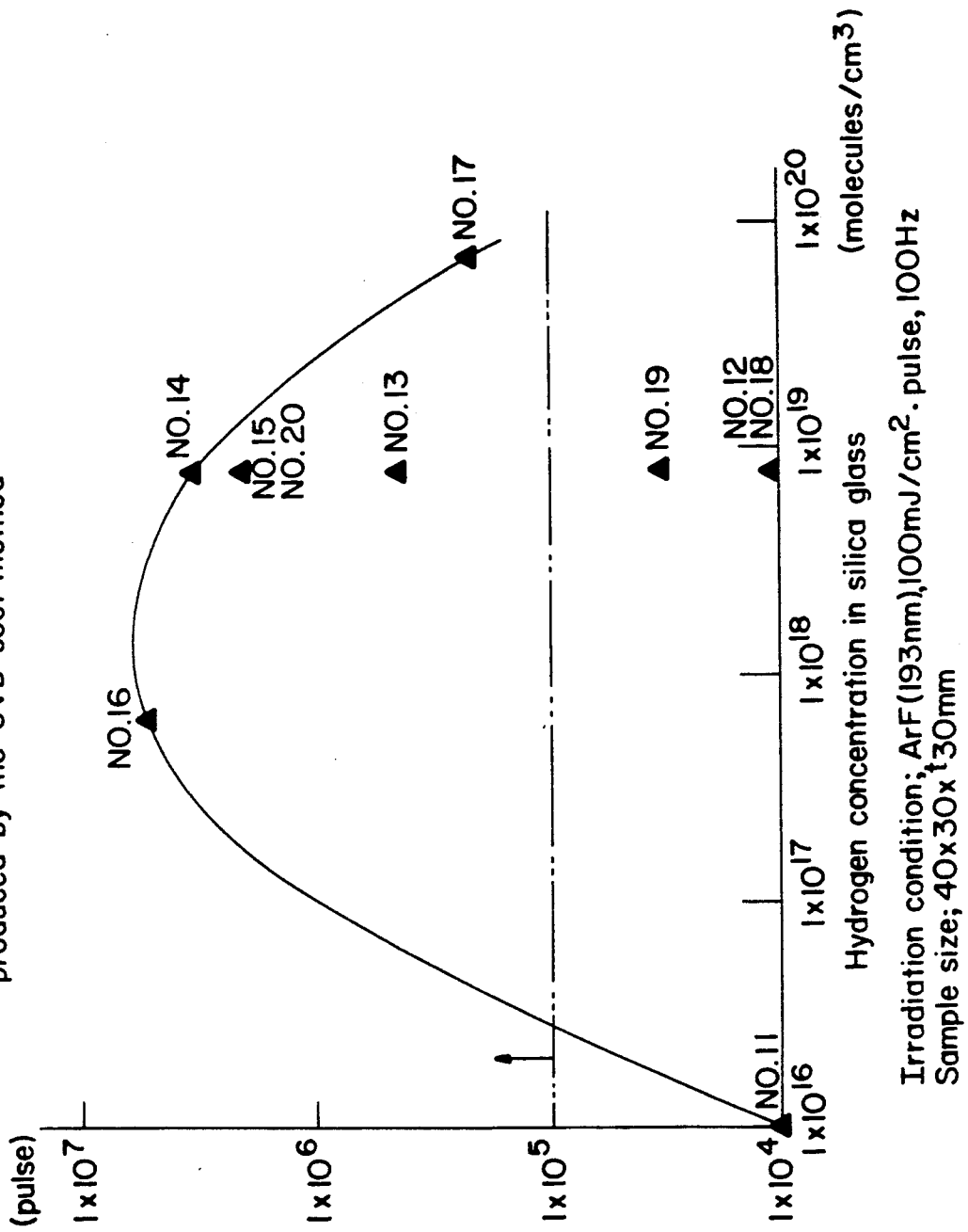

In order to confirm the relationship between the laser beam resistance and the hydrogen doping concentration for samples having an OH content of 200 wt. ppm, produced either by the CVD soot method or by the oxy-hydrogen flame hydrolysis method, ingots were produced by a process involving simultaneous annealing and hydrogen doping treatment under pressurized conditions at standard pressure, a pressure of 10 atmospheres, and a pressure of 100 atmospheres, respectively. The hydrogen concentration and the total number of irradiated pulses until the transmittance at 5.8 eV decreased by 2% were measured for each of the samples. The relationship was plotted as shown in FIGS. 1 and 2 (Sample Nos. 2 3, 4, 14, 16 and 17).

As can be seen from FIGS. 1A and B, with respect to the relation between the hydrogen concentration and the laser beam resistance to the KrF excimer laser (248 nm), the saturation value was from $1 \times 10^{18}$ to $1 \times 10^{20}$ (molecules/cm$^3$). It is expected that as the saturation value decreases, the laser resistance will also decrease. The hydrogen gas concentration range from $5 \times 10^{16}$ to $5 \times 10^{19}$ (molecules/cm$^3$) was within useful limits of resistance.

On the other hand, with an ArF excimer laser (193 nm), as shown in FIGS. 2A and B, at the lower limit of pulse resistance, the hydrogen concentration was not less than $5 \times 10^{16}$ (molecules/cm$^3$), which was similar to the minimum value observed for the KrF laser, but the existence of a maximum value became more apparent compared to a KrF excimer laser (248 nm). It is expected that if the hydrogen gas concentration were greater than $1 \times 10^{20}$ (molecules/cm$^3$), the total number of irradiated pulses which the optical member could withstand without a 2% decrease in transmittance would not exceed $1 \times 10^5$ (pulses), i.e. the ArF laser beam resistance would decrease to or below the lower limit of the usable range.

The adverse effect of metal element impurities on the resistance of an optical member to deterioration upon irradiation by short wavelength light, particularly an excimer laser beam, was confirmed by determining the resistance of prepared test pieces to optical deterioration over time upon exposure to a high-power ultraviolet laser beam.

To confirm how impurity metal elements present in the glass matrix affect UV laser beam resistance, synthetic silica glasses were produced by the oxy-hydrogen flame hydrolysis method and the CVD soot method (OH group: content 200 wt. ppm) using low-purity (undistilled) silicon tetrachloride raw material alone (Sample No. 18) or mixed 50/50 with high-purity (distilled) silicon tetrachloride raw material (Sample No. 6).

The impurity contents were analyzed, and the results are listed in Table 1 above.

After the low purity ingots were degassed in the manner described above, they were subjected to simultaneous annealing and hydrogen doping treatment. The hydrogen concentration and the total number of irradiated pulses until the transmittance decreased by 2% were measured as described above. For both Sample No. 18 and Sample No. 6, the laser beam resistance was less than the minimum usable limit. These results show the necessity of using high-purity material.

Experiments were also carried out to determine the allowable range of metal impurities and it was determined that to achieve good resistance, the total content of Li, Na, and K should be 150 ppb or less, the total content of Mg and Ca should be 100 ppb or less, and the total content of Ti, Cr, Fe, Ni, and Cu should be 50 ppb or less.

With respect to ingots that were made of high-purity synthetic silica glass produced by the oxy-hydrogen flame hydrolysis method and ingots that were made of high-purity synthetic silica glass produced by the CVD soot method (OH group content 200 wt. ppm) subjected to a simultaneous annealing and hydrogen doping treatment, but not to any heat treatment under an oxidizing atmosphere, the hydrogen concentration and the total number of irradiated pulses were measured in the same manner as above. The laser beam resistance was decreased only in the samples produced by the CVD soot method. Therefore, the samples were tested by the method of Shelby for the presence of oxygen defects, and oxygen deficiency defects were observed (Sample No. 19).

As described above, if ingots having oxygen deficiency defects are doped with hydrogen gas, the number of oxygen defects increases in some cases, depending on the conditions of the atmosphere. Therefore, if ingots contain oxygen defects, it is recommended to remove the oxygen defects before hydrogen doping. If the oxygen defects are removed first, then there are no restrictions on the nature of the atmosphere under which the annealing treatment can be carried out, thereby allowing, for example, a reducing ($H_2$) atmosphere to be used which enables simultaneous hydrogen doping to be effected. In this production procedure, since the annealing treatment and the hydrogen doping treatment are integrated, the production time needed for all the steps can be shortened, and the heat treatment energy can be used more efficiently.

However, if the annealing and hydrogen doping are carried out simultaneously in the production process, it becomes necessary to carry out hydrogen doping under a high-temperature atmosphere for the annealing treatment, and the treating time is liable to be restricted. Consequently, it may be difficult to carry out both the treatments very smoothly. If such difficulties arise, the annealing treatment and the hydrogen doping treatment may be carried out separately. In such a case a degassing step can be carried out after the annealing treatment step, and the hydrogen doping step is advantageously performed as the final heat treatment step to facilitate control of the doping concentration.

For example, to produce an optical glass, high-purity synthetic silica glass ingots prepared by the CVD soot method (OH group content 200 wt. ppm) were placed in a clean electric furnace with a silicon carbide heater in a high-purity alumina block in an oxygen containing atmosphere, heated at about 1,100° C. and cooled to eliminate oxygen deficiency defects and to anneal the glass. The heating and cooling program was as follows: (1) the ingots were first held at a temperature of approximately 1,100° C. for 50 hours; (2) the ingots were then allowed to cool at a rate of −2 degrees per hour to a temperature of 900° C.; and (3) the power source was switched off and the furnace with the ingots therein was allowed to cool to room temperature. The ingots were then placed in an electric furnace having a tungsten heater in a stainless steel jacket, degassed by heating at 600° to 800° C. under a vacuum atmosphere having a pressure of less than 0.1 atmosphere, and then cooled. The ingots were subsequently heated under a hydrogen gas atmosphere at a pressure of 10 atmospheres in the same electric furnace at about 500° to 900° C. for from 10 to 100 hours, depending on the size of the ingot, and thereafter the ingots were cooled at a controlled rate of approximately 100° C. per hour to a temperature of about 200° C., after which they were allowed to cool to room temperature. The hydrogen concentration and the total number of irradiated pulses until the transmittance decreased by 2% were measured for the resulting ingots, and the total number of irradiated pulses was never less than $1 \times 10^6$ (pulses) (Sample No. 20). Thus, a very advantageous laser beam resistance was obtained.

II. Example of a High Homogeneity Optical Member With Compensated Index of Refraction Distribution Although only the laser beam resistance was considered in the preceding Example of the invention, unless the variation of the refractive index which is caused by the annealing or other factors is compensated for to provide a highly optically homogeneous synthetic silica glass optical member for use in a laser lithography apparatus, it is not possible to expose a submicron scale fine line to produce a large scale integrated circuit. A further preferred embodiment of the present invention will now be described which includes a procedure for producing an optical member with such high optical homogeneity.

First, a silicon compound raw material, $CH_3Si(OCH_3)_3$, was subjected to distillation treatment to remove impurities, and the resulting high-purity raw material was stored in a stainless steel container lined with polytetrafluoroethylene ("DuPont Teflon"). The purified raw material was subjected to hydrolysis in an oxy-hydrogen flame to form a synthetic silica glass cylinder. The mixing ratio of the gases in the oxy-hydrogen flame was adjusted as described above and the burner was focussed on the periphery of the forming ingot such that the OH group concentration in a sectional plane orthogonal to the cylinder axis had a minimum value at the center and increased to a peak value near the outer periphery. The periphery of the ingot was then trimmed away to obtain a blank in which the OH group concentration had a substantially parabolic curved distribution which increased progressively from the center to the outside. The OH group concentration distribution in the synthetic silica glass ingot was controlled not only by adjusting the mixing ratio of the raw material gas and the oxy-hydrogen gas, but also by changing, for example, the shape or the position of the burner of the synthesis apparatus with respect to the forming glass ingot as described above.

Ingots having the OH group concentration distributions shown under Sample Nos. 21 and 22 in FIG. 9 were produced using the above control technique. The ingots identified by Sample Nos. 21 and 21' were produced at gas flow rates of 25-30 g/min for $CH_3Si(OCH_3)_3$, 300-400 l/min for hydrogen $(H)_2$, and 200-250 l/min for oxygen $(O_2)$. The ingots identified by Sample Nos. 22 and 22' were produced at gas flow rates of 25-30 g/min for $CH_3Si(OCH_3)_3$, 200-300 l/min for hydrogen $(H_2)$, and 150-200l/min for oxygen $(O_2)$. In both cases, the burner was focussed on the periphery of the forming ingots to produce an OH group concentration distribution which had a minimum value at the center of the blank and increased progressively to a peak value near the outer periphery. Then, after the ingots were cooled to room temperature, the outer peripheral side surface and the top and bottom surfaces of the cylindrical ingot were ground away to form $\phi 160 \times t$ 30 mm blanks. The OH group concentration distribution was measured with a UVIDEC-590 NIR spectrophotometer manufactured by Japan Spectroscopic Co., Ltd. In the blank produced from Sample No. 21 the OH group concentration increased from a minimum value of about 300 ppm at the center to a maximum value of about 330 ppm at the outer margin. The OH group concentration of the blank produced from Sample No. 22 varied from a minimum value of about 100 ppm at the center to a maximum of about 130 ppm at the periphery.

The refractive index distribution of each sample was measured with a He-Ne laser (633 nm) interferometer. Thus, a refractive index inhomogeneity ($\delta n$), i.e. a variation in the refractive index between the maximum point and the minimum point of the refractive index distribution curve (B), corresponding to the OH group concentration distribution curve was produced which was inversely correlated to the refractive index distribution induced by the fictive temperature distribution arising during the heating/cooling annealing treatment of the glass ingot.

The fictive temperature distribution fluctuation is influenced by the existing heat treatment and by the diameter of the synthetic silica glass ingot. Since the fictive temperature inhomogeneity ($\delta FT$) in the effective region or clear aperture of the optical member is not more than 4° C., the minimum values of the OH group concentration were selected to be 300 wt. ppm and 100 wt. ppm, for Sample Nos. 21 and 22, respectively, and the OH group concentration inhomogeneity ($\delta OH$) was selected to be within about 60 wt. ppm.

Silica glass ingots having the aforementioned OH group concentrations of 100 and 300 wt. ppm were placed in an extremely clean electric furnace having a tungsten heater in a stainless steel jacket, degassed by heating at 600° to 800° C. under a vacuum atmosphere at a pressure of less than 0.1 atmosphere, and then cooled. The degassed ingots then were heated at a temperature of about 1,100° C. and held for 50 hours under a hydrogen gas atmosphere to carry out a simultaneous annealing and hydrogen doping treatment, and they were subsequently cooled to a temperature of 900° C. per hour at a rate of $-2°$ C. per hour and then to a temperature of 200° C. at a faster rate to maintain the fictive temperature inhomogeneity ($\delta FT$) at about 2° C. in the effective region or clear aperture. Once the temperature reached about 200° C. or less, the ingots then were allowed to cool in the furnace to room temperature (Sample Nos. 21 and 22).

For comparison purposes, ingots were prepared which were treated in the same manner as described above except that they were only annealed in an air atmosphere (Sample Nos. 21' and 22').

The fictive temperature inhomogeneity ($\delta FT$) was selected to be within about 2° C. because if it is greater than about 2° C., the fictive temperature distribution curve is likely to be irregular.

Consequently, the refractive index distribution curve (C) in FIG. 9 induced by the fictive temperature distribution ($\delta FT$) in the sectional plane through the axis of the cylindrical blanks exhibits a minimum value at the axis of the blank and progressively increasing values toward the outer periphery. More specifically, an upwardly concave (substantially parabolic) refractive index distribution curve results in which the minimum value of the refractive index is at the center of the blank and which is a substantially symmetrical mirror image of the refractive index distribution curve (B) in FIG. 9 based on the OH group concentration distribution.

Therefore, since the overall the refractive index distribution curve (A) of a silica glass blank prepared from the heat-treated silica glass ingot by grinding away its outer peripheral portion, is the sum of the refractive index distribution (C) induced by the fictive temperature distribution ($\delta FT$) and the refractive index distribution (B) produced by the OH group concentration distribution ($\delta OH$), and since these refractive index distribution curves (B) and (C) substantially offset each other, a highly homogeneous silica glass blank can be obtained having a very small overall refractive index inhomogeneity ($\delta n$).

For example, a commercial optical member, prepared by cutting a desired part of such a blank 1 as illustrated in FIGS. 8A and 8B to produce an optical member 2A, 2B or 2C having a laser beam incident surface 2a oriented normal to the cylinder axis and then grinding and polishing as necessary, had a refractive index inhomogeneity ($\delta n$) of not more than $2 \times 10^{-6}$, thus showing high homogeneity.

Quasi-optical member test pieces for an excimer laser exposure experiment were prepared from blanks which were cut to a size of $40 \times 30 \times t$ 30 mm followed by polishing and final polishing of the opposite surfaces. In order to facilitate measurement of the $H_2$ gas content, polished samples having a size of $40 \times 20 \times t$ 1 mm were prepared for measuring the amount of $H_2$ released under vacuum conditions. The resulting test pieces were exposed using a KrF excimer laser (248 nm) under the following combinations of conditions:

energy densities per pulse of 100, 200, 400, and 800 ($mJ/cm^2$ .pulse), and total numbers of irradiated pulses of $1 \times 10^5$, $1 \times 10^6$, and $1 \times 10^7$ (pulses), respectively.

The variation in the refractive index distribution in the exposed test pieces was measured with a He-Ne laser (633 nm) interferometer. The loss of transmittance was measured with a UV spectrophotometer, and the fluorescence intensity was measured with a fluorescence spectrophotometer. The experimental results are illustrated in FIG. 9.

As can be seen from FIG. 9, very favorable results with respect to the fluorescence, the transmittance, the refractive index fluctuation, and the crack formation were obtained with Sample Nos. 21 and 22. But for Sample Nos. 21' and 22', which were annealed under an air atmosphere instead of a hydrogen atmosphere and from which only low amounts of $H_2$ were released, desirable results were not obtained.

In order to determine the effects of the OH group concentration, a comparative test blank was produced in which the gradient of the OH group concentration distribution was increased sharply so that it did not correspond to the refractive index distribution (C) induced by the fictive temperature distribution (Sample No. 23). The OH group concentration of the blank of Sample No. 23 varied from a minimum value of about 100 ppm at the center to a maximum value of about 250 ppm at the periphery.

Comparative sample pieces were produced from these blanks in the same way as described above for Sample Nos. 21 and 22, and the same tests described above were carried out on these comparative samples. In Comparative Example 23, only the occurrence of chemical bond breakage was below average, but the silica glass had such poor homogeneity that it was not suitable as an optical material.

The metal element contents of the heat-treated blanks were approximately the same as those of Sample Nos. 1 and 11 in the foregoing Table 1. This shows that the high purity of the silica glass was retained during the heat treatment.

III. Examples of Blanks of Synthetic Silica Glass Produced Using High-Purity Silicon Tetrachloride Although raw material free of the element chlorine (Cl) was described in the preceding examples, since silicon tetrachloride is used in many cases as a raw material for producing synthetic silica glass, the glass frequently contains significant amounts of Cl as well as OH groups. Consequently, it may be difficult to suppress fluctuations in the refractive index without taking the chlorine distribution into consideration. Therefore, in accordance with a further preferred embodiment of the invention, highly optically homogeneous synthetic silica glass is produced from high-purity silicon tetrachloride raw material.

Cylindrical ingots of high-purity silica glass were produced from silicon tetrachloride raw material by the oxy-hydrogen flame hydrolysis method. The gas flow rate ranges for Sample Nos. 31 through 34 are set forth in the following Table 3:

TABLE 3

| Sample No. | Feed Raw Material | Feed Flow Rate g/min. | $H_2$ Flow Rate l/min. | $O_2$ Flow Rate l/min. |
| --- | --- | --- | --- | --- |
| 31 | $SiCl_4$ | 30–40 | 350–400 | 50–80 |
| 32 | $SiCl_4$ | 30–40 | 300–350 | 70–100 |
| 33 | $SiCl_4$ | 30–40 | 300–350 | 70–100 |
| 34 | $SiCl_4$ | 30–40 | 350–400 | 50–80 |

For Sample No. 31 the gas flow rates were adjusted to be slightly rich in $H_2$ and slightly lean in $O_2$. For Sample No. 32 the gas flow rates were adjusted to be slightly lean in $H_2$ and slightly rich in $O_2$. For Sample No. 33 the gas flow rates were adjusted to be slightly lean in $H_2$ and rich in $O_2$, and for Sample No. 34 the flow rates were slightly rich in $H_2$ and lean in $O_2$. In preparing Sample Nos. 31 and 32, the burner was focussed on the periphery of the forming ingots, while Sample Nos. 33 and 34 were prepared by focussing the burner on the central axis of the rotating ingot. These mixing ratios of the gases and burner orientations were selected so that the concentration distribution curves of the OH group concentration distribution, the Cl concentration distribution and the respective concentration distribution differences in a section orthogonal to the cylinder axis were predetermined such that:

as shown for Sample No. 31 in FIG. 10, the OH group concentration inhomogeneity (δOH) was a concave curve having a height of −20 wt. ppm, and the chlorine concentration inhomogeneity (δCl) was a convex curve having a height of +10 wt. ppm;

as shown for Sample No. 32, both the OH distribution curve and the Cl distribution curve were concave curves; the OH group concentration inhomogeneity (δOH) having a height of −40 wt. ppm, and the chlorine concentration inhomogeneity (δCl) having a height −10 wt. ppm;

as shown for Sample No. 33, both the OH distribution curve and the Cl distribution curve were convex curves; the OH group concentration inhomogeneity (δOH) being +10 wt. ppm, and the chlorine concentration inhomogeneity (δCl) being +40 wt. ppm; and as shown for Sample No. 34, in contrast to the results in Test No. 31, the OH distribution inhomogeneity (δOH) was a convex curve having a height of +20 wt. ppm, and the chlorine distribution inhomogeneity (δCl) was a concave curve having a height of −10 wt. ppm.

In each of the glass ingots, the minimum value of the OH group concentration distribution was not less than 100 wt. ppm.

The refractive index distribution (B) was calculated for each of the ingots produced as described above. It was determined that in each of Test Nos. 31 to 33, the refractive index inhomogeneity (δn) corresponding to the combined OH group distribution and chlorine distribution (δOH and δCl) was a convex curve having a magnitude of about $3 \times 10^{-6}$, and in No. 34 it was a concave curve having a magnitude of about $-3 \times 10^{-6}$.

The synthetic silica glass ingots produced as described above were placed in an extremely clean electric furnace having a tungsten heater in a stainless steel jacket in the same manner as described above, degassed by heating at 600° to 800° C. under a vacuum atmosphere at a pressure of less than 0.1 atmosphere, and then cooled. Then, after heating in the same electric furnace at a rate of 200° C. per hour up to a temperature of about 1,100° C. and held for 50 hours under a hydrogen gas atmosphere hours to carry out a simultaneous annealing/hydrogen doping treatment, the ingots were cooled to 900° C. at a rate of −2° C. per hour, and then further cooled in a controlled fashion to maintain the fictive temperature distribution inhomogeneity (δFT) at about 2° C. in the effective region (clear aperture) until the temperature reached about 200° C. or less. The ingots were subsequently allowed to cool in the furnace to room temperature. Thereafter, the outer circumference and the top and bottom surfaces were ground to form ϕ160×t 30 mm blanks.

To prevent the fictive temperature distribution curve from becoming irregular, it is preferred that the fictive temperature distribution inhomogeneity produced by the current heat treatment be maintained within 4° C., and therefore it is preferable that the minimum point or the minimum concentration region of the OH group concentration not be less than 100 wt. ppm.

The refractive index distribution curve (C) induced by the fictive temperature distribution (δFT) in the sectional plane through the axis of the cylindrical blank was a curve which exhibited a minimum value at the axis of the blank and progressively increasing values toward the outer periphery. More specifically, the fictive temperature distribution was a concave (substantially parabolic) curve which exhibited a minimum value at the center of the blank, and which is a substantially symmetrical mirror image of the refractive index distribution curve (B) due to the combined effects of the OH concentration distribution and the Cl concentration distribution of the ingot.

Therefore, since the overall refractive index distribution (A) of the blanks was determined by the sum of the refractive index distribution (C) resulting from the fictive temperature distribution and the refractive index distribution (B) resulting from the combination of the OH and Cl concentration distributions, the overall refractive index distribution inhomogeneity ($\delta n$) of each of Test Nos. 31, 32, and 33 was less than $1 \times 10^{-6}$. The blanks thus show very high optical homogeneity.

However, in contrast, in Comparative Sample No. 34, the refractive index distribution curves (B) and (C) did not offset each other, and the overall refractive index distribution inhomogeneity was increased to a value ($\delta n$) of about $6 \times 10^{-6}$, which was a poor $\delta n$ value.

The contents of metal elements in the heat-treated blanks were analyzed, and it was found that the content of each alkali metal element, Li, Na, and K, was not over 0.05 wt. ppm, the content of each alkali earth metal element, Mg and Ca, was about 0.01 wt. ppm, and the content of each transition metal element, Ti, Cr, Fe, Ni, and Cu, was not over 0.01 wt. ppm. These results show that high purity was not lost in the heat treatment step.

The above blanks were cut to obtain $40 \times 30 \times t$ 30 mm quasi-optical members. Then the opposite surfaces of the members were polished to form test pieces for an excimer laser exposure experiment, and the resulting test pieces were exposed using a KrF excimer laser (248 nm) or an ArF excimer laser (193 nm) under the following combinations of exposure conditions:

energy densities per pulse of 100, 200, and 400 (mJ/cm$^2$.pulse), and total numbers of irradiated pulses of $1 \times 10^5$, $1 \times 10^6$, and $1 \times 10^7$ (pulses), respectively.

Changes in the refractive index distribution in the exposed test pieces were measured with an He-Ne laser (633 nm) interferometer; changes in the transmittance were measured with a UV spectrophotometer, and changes in the fluorescence intensity were measured with a fluorescence spectrophotometer. The experimental results are listed in the following Table 4.

suitable as optical silica glass for lens material in view of its poor initial homogeneity.

To confirm the effects of the present invention, an ingot was produced in which the OH group concentration distribution was decreased so that the minimum point of the OH group concentration was less than 5 wt. ppm. Comparison blanks were prepared by taking sample pieces from optical members prepared in the same way as Sample No. 31. The same tests as those described above were carried out, and the assessments of the fluorescence, the transmittance, and the variation in the refractive index with respect to the excimer laser beam resistance were all at or below the average level. These experimental results confirm that the present invention has the desired effects.

COMPARATIVE EXAMPLE

To confirm the inability of hydrogen doping alone to provide optical members with good laser resistance, natural quartz optical glass (Herasil and Infrasil quartz glass, manufactured by HQS) was treated in a hydrogen atmosphere at 500° C. The treated glass was then exposed to a KrF excimer laser. It was found that at an energy density of 400 mJ/cm$^2$ pulse, an E' center was formed after exposure to only 100 pulses, and the transmittance of the glass simultaneously decreased. This clearly shows that mere hydrogen doping does not enable silica glass to resist damage from exposure to an ultraviolet light beam.

The foregoing description and examples have been set forth merely to illustrate the invention and are not intended to be limiting. Since modifications of the described embodiments incorporating the spirit and substance of the invention may occur to persons skilled in the art, the scope of the invention should be construed to include all variations falling within the ambit of the appended claims and equivalents thereof.

What is claimed is:

1. A synthetic silica glass optical member for use with a high-power ultraviolet laser beam having a wavelength shorter than 250 nm, wherein said optical member is made of high-purity synthetic silica glass material which is free from striae in at least one direction corresponding to the incident light, and said member has an

TABLE 4

| Sample No. | Released Hydrogen Molecule | KrF Laser Resistance | | | | ArF Laser Resistance | | | | Minimum OH Group Conc. ppm |
|---|---|---|---|---|---|---|---|---|---|---|
| | | Transmittance | Refract. Index | Fluorescence | Overall Perform. | Transmittance | Refract. Index | Fluorescence | Overall Perform. | |
| 31 | $5 \times 10^{21}$ | Durable | Durable | Weak Emission | Excellent | Durable | Durable | Weak Emission | Excellent | 250 |
| 32 | $5 \times 10^{21}$ | Durable | Average | Weak Emission | Excellent | Durable | Average | Weak Emission | Excellent | 150 |
| 33 | $5 \times 10^{21}$ | Durable | Durable | Weak Emission | Excellent | Durable | Durable | Weak Emission | Excellent | 250 |
| 34 | $5 \times 10^{21}$ | Average | Average | Weak Emission | Fair | Average | Poor | Weak Emission | Fair | 150 |

As can be from Table 4, in the case of Sample Nos. 31, 32, and 33 in which the released amount of H$_2$ was not less than $1 \times 10^{20}$ (molecules/m$^2$), and the overall refractive index distribution was constant, the fluorescence, the transmittance, the variation in the refractive index, and the resistance to deterioration in optical properties over time when exposed to an excimer laser beam were found to be very favorable. But in the case of Sample No. 34 in which the refractive index inhomogeneity ($\delta n$) was large, the test piece was basically un- OH group concentration of at least about 100 wt. ppm, and a doped hydrogen molecule concentration of at least about $5 \times 10^{16}$ molecules/cm$^3$ sufficient to inhibit decreases in light transmittance over time due to exposure to light from said laser beam.

2. An optical member as claimed in claim 1, for use with a high-power ultraviolet laser beam having a wavelength shorter than 200 nm, wherein said member has an OH group concentration of at least about 100 wt. ppm, and a doped hydrogen molecule concentration within the range from $5\times 10^{16}$ to $5\times 10^{19}$ molecules/cm$^3$.

3. An optical member as claimed in claim 2, wherein said high-power ultraviolet laser beam is an ArF excimer laser beam.

4. An optical member as claimed in claim 2, wherein the OH group concentration is at least about 200 wt. ppm.

5. An optical member as claimed in claim 1, wherein said high-power ultraviolet laser beam is a KrF excimer laser beam.

6. An optical member as claimed in claim 1, wherein said optical member has a refractive index inhomogeneity ($\delta n$) of less than or equal to $2\times 10^{-6}$ in a plane orthogonal to the incident light.

7. An optical member as claimed in claim 1, wherein said optical member has a glass structure substantially free from oxygen defects.

8. An optical member as claimed in claim 1, wherein said optical member has an impurity content such that the total content of Li, Na, and K is 150 ppb or less, the total content of Mg and Ca is 100 ppb or less, and the total content of Ti, Cr, Fe, Ni, and Cu is 50 ppb or less.

9. An optical member as claimed in claim 1, wherein said optical member has the following impurity contents: Na$\leq$50 ppb, K$\leq$50 ppb, Li$\leq$50 ppb, Mg$\leq$10 ppb, Ca$\leq$10 ppb, Ti$\leq$10 ppb, Cr$\leq$10 ppb, Fe$\leq$10 ppb, Ni$\leq$10 ppb, and Cu$\leq$10 ppb.

10. An optical member as claimed in claim 1, wherein said optical member is selected from the group consisting of lenses, prisms, filters, windows, reflectors, etalon plates, and semifinished products used in a lithography apparatus that uses an excimer laser beam, YAG higher harmonics laser beam, or other high-power ultraviolet laser beam for producing large scale integrated circuits.

11. An optical member as claimed in claim 1, wherein said optical member is free of striae in three dimensions.

12. An optical member as claimed in claim 1, wherein said optical member has a birefringence of 5 nm/cm or less.

13. A synthetic silica glass optical member for use with a high-power ultraviolet laser beam having a wavelength shorter than 250 nm, wherein said optical member is made of high-purity synthetic silica glass material which is free from striae in at least one direction corresponding to the incident light, and said member has an OH group concentration of at least about 100 wt. ppm, and a doped hydrogen molecule concentration sufficient to inhibit decreases in light transmittance over time due to exposure to light from said laser beam, said hydrogen concentration being such that when the temperature of said optical member is raised to 1,000° C. under vacuum, at least about $1\times 10^{20}$ molecules/m$^2$ of dopant gas are released from said member.

14. An optical member as claimed in claim 13, for use with a high-power ultraviolet laser beam having a wavelength shorter than 200 nm, wherein said member has an OH group concentration of at least about 100 wt. ppm, and a doped hydrogen molecule concentration such that when the temperature of said member is raised to 1,000° C. under vacuum, from $1\times 10^{20}$ to $1\times 10^{23}$ molecules/m$^2$ of dopant gas are released from said member.

15. An optical member as claimed in claim 14, wherein the OH group concentration is at least about 200 wt. ppm.

16. An optical member as claimed in claim 14 wherein said high-power ultraviolet laser beam is an ArF excimer laser beam.

17. An optical member as claimed in claim 13 wherein said high-power ultraviolet laser beam is a KrF excimer laser beam.

18. An optical member as claimed in claim 13, wherein said optical member has a refractive index inhomogeneity ($\delta n$) of less than or equal to $2\times 10^{-6}$ in a plane orthogonal to the incident light.

19. An optical member as claimed in claim 13, wherein said optical member has a glass structure substantially free from oxygen defects.

20. An optical member as claimed in claim 13, wherein said optical member has an impurity content such that the total content of Li, Na, and K is 150 ppb or less, the total content of Mg and Ca is 100 ppb or less, and the total content of Ti, Cr, Fe, Ni, and Cu is 50 ppb or less.

21. An optical member as claimed in claim 13, wherein said optical member has the following impurity contents: Na$\leq$50 ppb, K$\leq$50 ppb, Li$\leq$50 ppb, Mg$\leq$10 ppb, Ca$\leq$10 ppb, Ti$\leq$10 ppb, Cr$\leq$10 ppb, Fe$\leq$10 ppb, Ni$\leq$10 ppb, and Cu$\leq$10 ppb.

22. An optical member as claimed in claim 13, wherein said optical member is selected from the group consisting of lenses, prisms, filters, windows, reflectors, etalon plates, and semifinished products used in a lithography apparatus that uses an excimer laser beam, YAG higher harmonics laser beam, or other high-power ultraviolet laser beam for producing large scale integrated circuits.

23. An optical member as claimed in claim 13, wherein said optical member is free of striae in three dimensions.

24. An optical member as claimed in claim 13, wherein said optical member has a birefringence of 5 nm/cm or less.

25. A blank for a synthetic silica glass optical member for use with incident light having a wavelength shorter than about 360 nm, wherein said blank is made of a heat treated high-purity silica glass material which is free from striae at least in a direction parallel to the incident light and which contains OH groups, said blank having a minimum OH group concentration of at least about 100 wt. ppm and an OH group concentration distribution in a plane orthogonal to the incident light such that the OH concentration progressively increases from a minimum concentration region to a maximum concentration region without an inflection point so that said blank has an overall refractive index distribution inhomogeneity ($\delta n$) in said plane of $2\times 10^{-6}$ or less, and wherein said blank is doped with hydrogen.

26. A blank as claimed in claim 25, wherein the blank is doped with hydrogen such that when said blank is heated in a vacuum, at least about $1\times 10^{20}$ molecules/m$^2$ of hydrogen are released.

27. A blank for a synthetic silica glass optical member for use with incident light having a wavelength shorter than about 360 nm, wherein said blank is made of a high-purity synthetic silica glass material which is free from striae in at least a direction parallel to the incident light, and which contains concentrations of OH groups and chlorine (Cl) distributed therein, said blank having a first refractive index distribution due to a fictive temperature distribution caused during heating/cooling treatment of the blank, and said first refractive index distribution is substantially offset by a second refractive index distribution due to a combination of the chlorine concentration distribution and the OH group concentration distribution in a plane orthogonal to the incident light.

28. A blank as claimed in claim 27, wherein said blank has a minimum OH group concentration of at least about 100 wt. ppm, and said blank is doped with hydrogen.

29. A blank as claimed in claim 27, wherein said blank has a minimum OH group concentration of at least about 100 wt. ppm, and said blank is doped with hydrogen such that when said blank is heated in a vacuum, at least about $1 \times 10^{20}$ molecules/m$^2$ of hydrogen are released.

30. A blank as claimed in claim 27, wherein the combination of the concentration distributions is such that the OH group concentration distribution is a concave curve having a minimum value at the center of the blank and the chlorine concentration distribution is a convex curve having a maximum value at the center of the blank.

31. A blank as claimed in claim 27, wherein the combination of the concentration distributions is such that both the concentration distributions are concave curves, and the relationship between the concentration inhomogeneities ($\delta$OH and $\delta$Cl) is such that the OH group concentration distribution is greater than the chlorine concentration distribution.

32. A blank as claimed in claim 27, wherein the combination of the concentration distributions is such that both the concentration distributions are convex curves, and the relationship between concentration inhomogeneities ($\delta$OH and $\delta$Cl) is such that the chlorine concentration distribution is greater than the OH group concentration distribution.

33. A method of producing an optical member or blank for use with light having a wavelength range shorter than about 360 nm, said method comprising the steps of:
forming a blank from high-purity synthetic silica glass containing OH groups in an amount of at least 50 wt. ppm; removing striae from said blank in at least one direction; degassing by heating said synthetic silica glass at 200° to 1,000° C. under vacuum to remove gases contained in the glass;
removing internal strains from said blank by heating the blank at a temperature of at least 1,000° C., and doping said silica glass with sufficient hydrogen to inhibit decreases in light transmittance over time due to exposure to ultraviolet light.

34. A method of producing an optical member or blank for use with light having a wavelength rang shorter than about 360 nm, said method comprising the steps of:
forming a blank from high-purity synthetic silica glass containing OH groups in an amount of at least 50 wt. ppm; removing striae from said blank in at least one direction;
removing internal strains from said bank by heating the blank at a temperature of 1,000° to 1,200° C., and doping said silica glass under an elevated pressure atmosphere containing hydrogen heated to a temperature lower than the temperature of the heated atmosphere of the internal strain removing step such that said glass contains sufficient hydrogen to inhibit decreases in light transmittance over time due to exposure to ultraviolet light.

35. A method as claimed in claim 34, further comprising between the internal strain removing step and the doping step, the additional step of degassing the glass by heating at 200° to 1,000° C. under subatmospheric pressure to remove gases contained in the glass.

36. An optical device comprising in combination a synthetic silica glass optical member for use with ultraviolet incident light having a wavelength shorter than about 360 nm, wherein said optical member is made of high-purity synthetic silica glass material which is free from striae in at least one direction corresponding to the incident light and which contains OH groups in an amount of at least about 50 wt. ppm, and said optical member is doped with hydrogen sufficient to inhibit decreases in light transmittance over time due to exposure to said ultraviolet light and a source of radiation arranged to irradiate said optical member.

37. An optical device as claimed in claim 36, wherein said source of radiation is an ultraviolet laser having a wavelength in the range from about 360 nm to about 150 nm.

38. A synthetic silica glass optical member for use with ultraviolet incident light having a wavelength shorter than about 360 nm, wherein said optical member is made of an annealed high-purity synthetic silica glass material which is free from striae in at least one direction corresponding to the incident light and which contains OH groups in an amount of at least about 50 wt. ppm and chlorine (Cl) distributed therein, and said optical member is doped with hydrogen sufficient to inhibit decreases in light transmittance over time due to exposure to said ultraviolet light, and said optical member has a first refractive index distribution due to a fictive temperature distribution caused during annealing of said silica glass, and said first refractive index distribution is substantially offset by a second refractive index distribution due to a combination of variations in the chlorine distribution and variations in the OH group distribution in a plane orthogonal to the incident light.

39. A synthetic silica glass optical member for use with a source of ultraviolet incident light having a wavelength shorter than about 360 nm, wherein said optical member is made of a high-purity synthetic silica glass material which is free from striae in at least one direction corresponding to the incident light and which contains OH groups in an amount of at least about 50 wt. ppm, and said optical member is doped with hydrogen sufficient to inhibit decreases in light transmittance over time due to exposure to said ultraviolet light, said optical member having an OH group concentration distribution in a plane orthogonal to the incident light such that the OH concentration increases progressively from a minimum concentration region to a maximum concentration region without an inflection point so that the refractive index distribution inhomogeneity ($\delta$n) in said plane is $2 \times 10^{-6}$ or less.

* * * * *

UNITED STATES PATENT AND TRADEMARK OFFICE
CERTIFICATE OF CORRECTION

PATENT NO. : 5,086,352
DATED : February 4, 1992
INVENTOR(S) : Shigeru Yamagata et al.

It is certified that error appears in the above-indentified patent and that said Letters Patent is hereby corrected as shown below:

Title page, item [75],
Please insert the address for the first-named assignee as follows:

Shin-Etsu Quartz Co., Ltd.
Tokyo, Japan,

Signed and Sealed this

Third Day of June, 1997

Attest:

BRUCE LEHMAN

Attesting Officer

Commissioner of Patents and Trademarks

UNITED STATES PATENT AND TRADEMARK OFFICE
CERTIFICATE OF CORRECTION

PATENT NO. : 5,086,352
DATED : February 4, 1992
INVENTOR(S) : Shigeru Yamagata et al It is certified that error appears in the above-identified patent and that said Letters Patent is hereby corrected as shown below:

Title page, item [73]
Please insert the address for the first-named assignee as follows:

Shin-Etsu Quartz Products Co., Ltd., Tokyo, Japan and delete "both of".

This certificate supersedes Certificate of Correction issued June 3, 1997.

Signed and Sealed this

First Day of December, 1998

Attest:

BRUCE LEHMAN

Attesting Officer     Commissioner of Patents and Trademarks